United States Patent
Fuchimukai

(10) Patent No.: US 10,622,782 B2
(45) Date of Patent: Apr. 14, 2020

(54) WAVELENGTH CONVERTING APPARATUS

(71) Applicant: GIGAPHOTON INC., Tochigi (JP)

(72) Inventor: Atsushi Fuchimukai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/208,687

(22) Filed: Dec. 4, 2018

(65) Prior Publication Data

US 2019/0103725 A1 Apr. 4, 2019

Related U.S. Application Data

(63) Continuation of application No. PCT/JP2016/070235, filed on Jul. 8, 2016.

(51) Int. Cl.
*H01S 5/00* (2006.01)
*H01S 3/23* (2006.01)
(Continued)

(52) U.S. Cl.
CPC .............. *H01S 5/0092* (2013.01); *G02F 1/37* (2013.01); *H01S 3/0092* (2013.01); *H01S 3/025* (2013.01); *H01S 3/2391* (2013.01); *H01S 5/0085* (2013.01); *H01S 5/0611* (2013.01); *H02K 11/215* (2016.01); *H02K 11/25* (2016.01);
(Continued)

(58) Field of Classification Search
CPC .................................................... H01S 5/0092
See application file for complete search history.

(56) References Cited

U.S. PATENT DOCUMENTS 6,494,584 B1  12/2002 Wada et al.
6,859,335 B1  2/2005 Lai et al.
(Continued)

FOREIGN PATENT DOCUMENTS

JP  2000-347234 A  12/2000
JP  2011-507305 A  3/2011
(Continued)

OTHER PUBLICATIONS

International Search Report issued in PCT/JP2016/070235; dated Oct. 4, 2016.
(Continued)

*Primary Examiner* — Rhonda S Peace
(74) *Attorney, Agent, or Firm* — Studebaker & Brackett PC

(57) ABSTRACT

A wavelength converting apparatus includes a moving device including a crystal holder holding a nonlinear crystal for converting a wavelength of laser light incident thereon and outputting the laser light, and a driving unit including a voice coil motor and moving the holder at least in a direction orthogonal to a first direction that is an optical path axis direction of the laser light. The driving unit turns the holder to change an incident angle of the laser light on the crystal. The driving unit includes: a two-dimensional driving unit including a planar voice coil motor, and a one-dimensional driving unit including a cylindrical voice coil motor. The two-dimensional driving unit performs linear driving in a second direction orthogonal to the first direction, and rotary driving around a third direction orthogonal to the first and second directions. The one-dimensional driving unit performs linear driving in the third direction.

17 Claims, 16 Drawing Sheets

(51) Int. Cl.
- *G02F 1/37* (2006.01)
- *H02K 11/215* (2016.01)
- *H02K 11/25* (2016.01)
- *H01S 3/00* (2006.01)
- *H01S 3/02* (2006.01)
- *H01S 5/06* (2006.01)
- *H02K 41/035* (2006.01)
- *H01S 3/16* (2006.01)
- *H01S 5/12* (2006.01)

(52) U.S. Cl.
CPC ........ *H02K 41/0354* (2013.01); *H01S 3/0071* (2013.01); *H01S 3/1618* (2013.01); *H01S 3/2375* (2013.01); *H01S 5/12* (2013.01)

(56) References Cited

U.S. PATENT DOCUMENTS

| | | | |
|---|---|---|---|
| 9,482,928 B2* | 11/2016 | Perkins | G02F 1/353 |
| 9,915,853 B2* | 3/2018 | Nguyen | G02F 1/39 |
| 2008/0219302 A1 | 9/2008 | Nakayama et al. | |
| 2010/0128343 A1 | 5/2010 | Imai et al. | |
| 2012/0160856 A1 | 6/2012 | Armstrong | |
| 2014/0362880 A1 | 12/2014 | Chuang et al. | |
| 2015/0195460 A1 | 7/2015 | Yasuda | |
| 2016/0294154 A1* | 10/2016 | Tanaka | G02F 1/353 |
| 2016/0341925 A1 | 11/2016 | Ziolek et al. | |
| 2019/0103725 A1* | 4/2019 | Fuchimukai | H01S 3/025 |

FOREIGN PATENT DOCUMENTS

| | | |
|---|---|---|
| JP | 4729093 B2 | 7/2011 |
| JP | 2011-204947 A | 10/2011 |
| JP | 5225715 B2 | 7/2013 |
| JP | 2015-129855 A | 7/2015 |
| WO | 2015/117849 A1 | 8/2015 |

OTHER PUBLICATIONS

The International Preliminary Report on Patentability and Translation of Written Opinion of the International Searching Authority; PCT/JP2016/070235; dated Jan. 8, 2019.

* cited by examiner

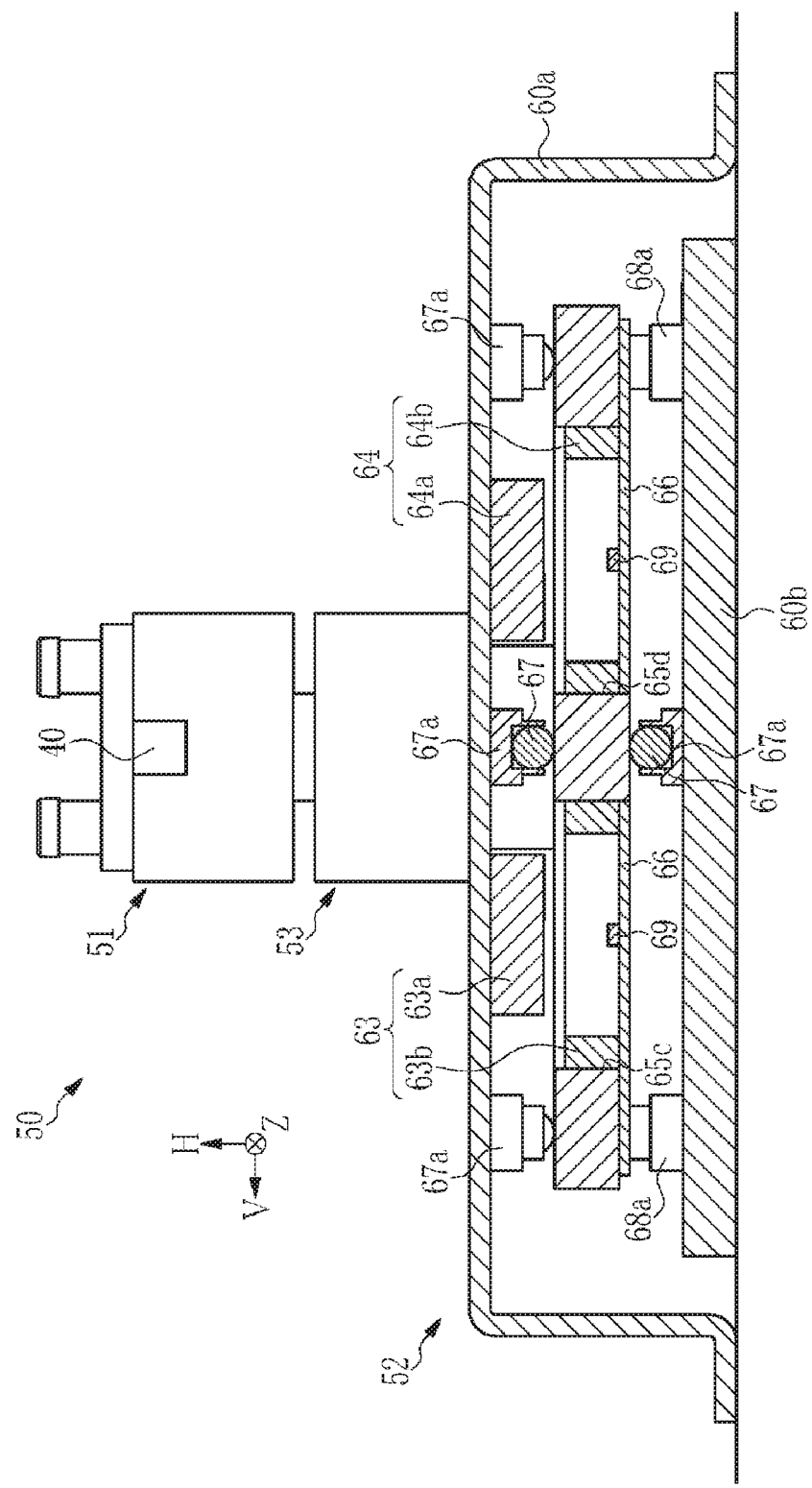

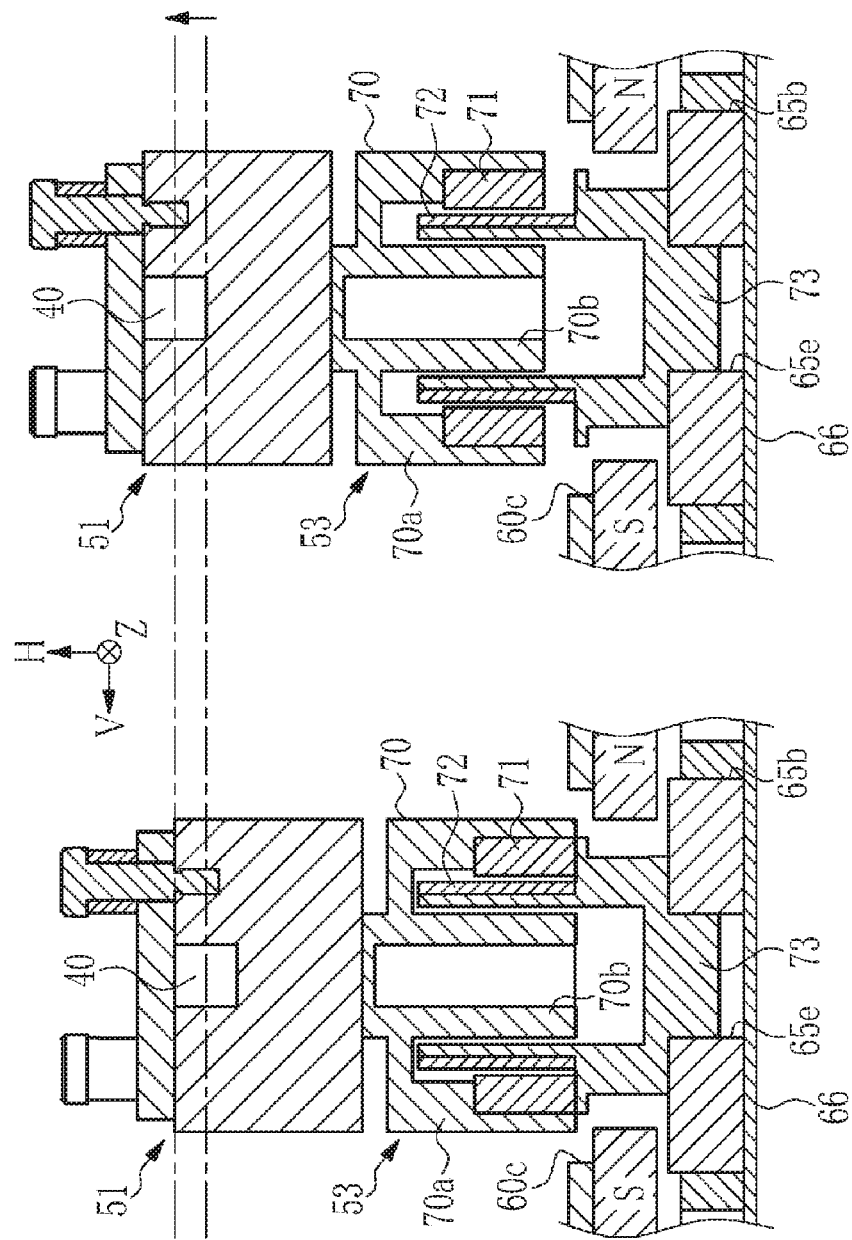

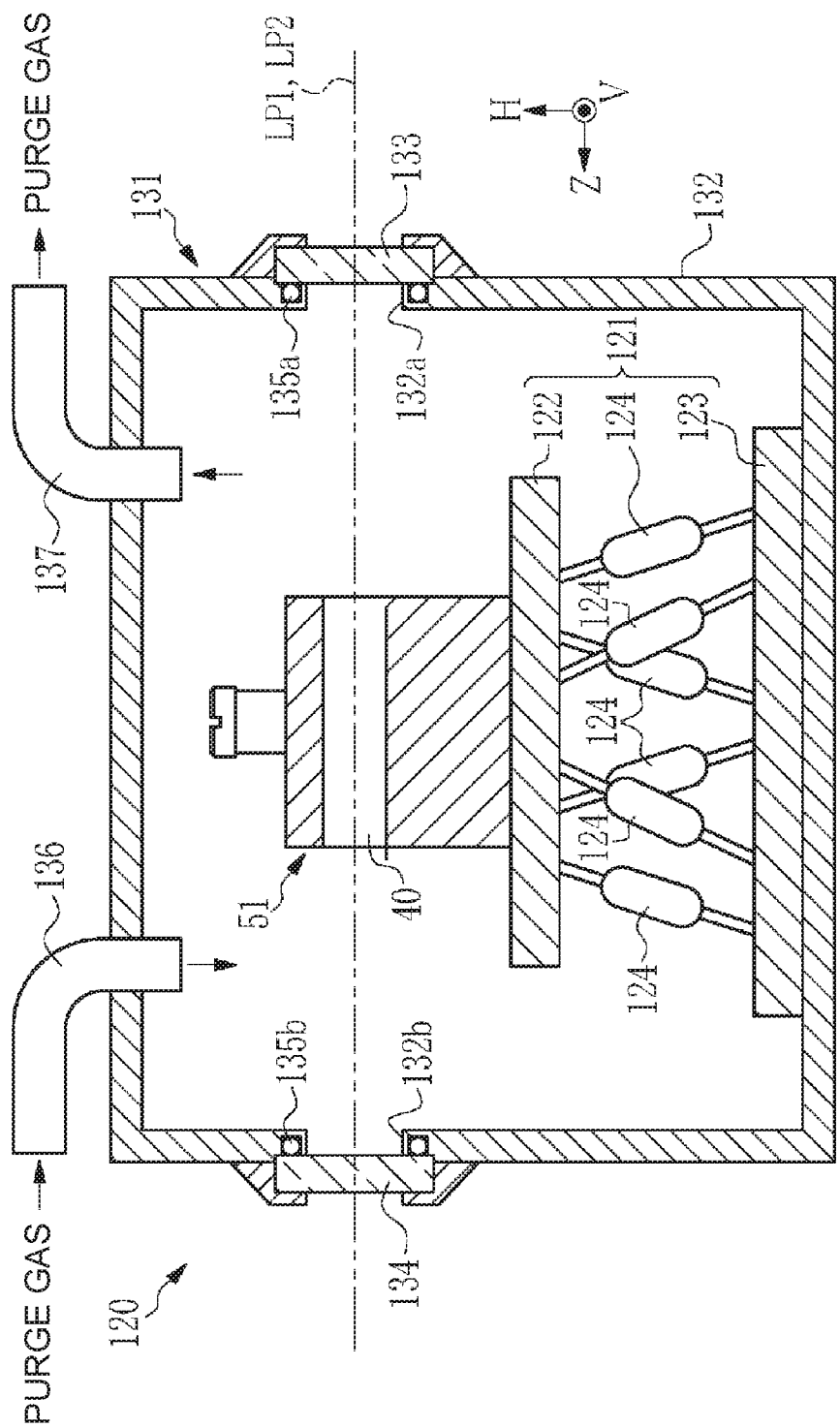

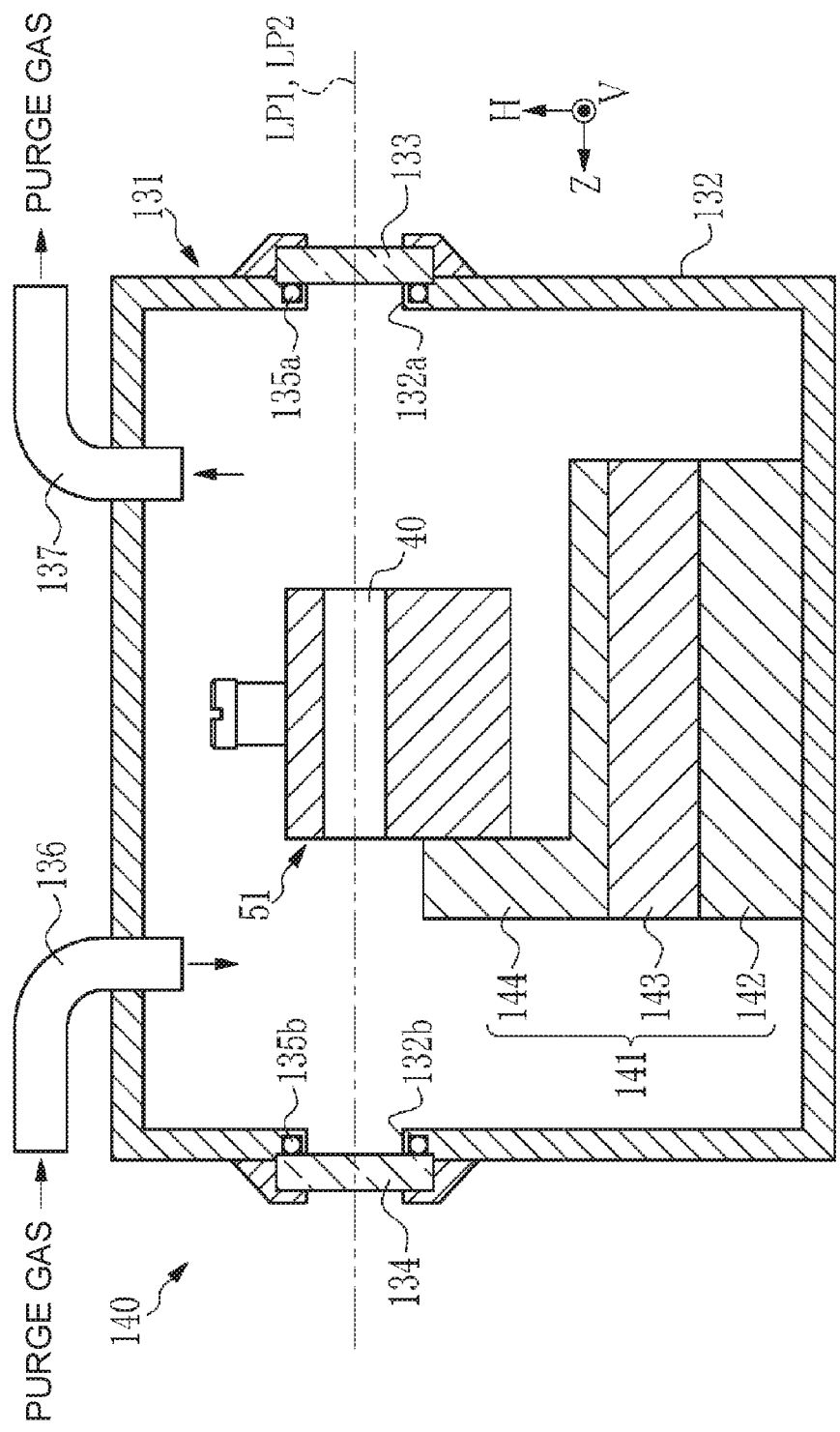

WAVELENGTH CONVERTING APPARATUS

CROSS-REFERENCE TO RELATED APPLICATIONS

The present application is a continuation application of International Application No. PCT/JP2016/070235 filed on Jul. 8, 2016. The content of the application is incorporated herein by reference in its entirety.

BACKGROUND

1. Technical Field

The present disclosure relates to a wavelength converting apparatus used in a laser apparatus.

2. Related Art

Along with development of micronizing and high integration of semiconductor integrated circuits, an improvement in resolution is required in semiconductor exposure devices. Hereinafter, a semiconductor exposure device will be simply referred to as an "exposure device". Accordingly, a wavelength of light output from an exposure light source is getting shortened. As an exposure light source, a gas laser is used, instead of a conventional mercury lamp. At present, as for laser apparatuses for exposure, a KrF excimer laser that outputs ultraviolet light having a wavelength of 248 nm, and an ArF excimer laser that outputs ultraviolet light having a wavelength of 193.4 nm are used.

Currently, as an exposure technology, immersion exposure has been put into practice. In the immersion exposure, a space between a projection lens on the exposure device side and a wafer is filled with liquid, whereby the refractive index of the space is changed. Thereby, an apparent wavelength of the light source for exposure is shortened. In the case where immersion exposure is performed with use of an ArF excimer laser as a light source for exposure, a wafer is irradiated with ultraviolet light having a wavelength of 134 nm in the water. This technology is called ArF immersion exposure. ArF immersion exposure is also referred to as ArF immersion lithography.

The spectral linewidth in natural oscillation in KrF and ArF excimer lasers is wide, approximately ranging from 350 pm to 400 pm. This causes chromatic aberration of laser light (ultraviolet light) reduced and projected on the wafer by the projection lens on the exposure device side. Thereby, the resolution is lowered. As such, it is necessary to narrow the spectral linewidth of laser light output from a gas laser to a degree in which chromatic aberration can be disregarded. Accordingly, in a laser resonator of a gas laser, a line narrowing module having a line narrowing element is provided. By the line narrowing module, narrowing of the spectral linewidth is realized. The line narrowing element may be an etalon, a grating, or the like. A laser apparatus in which the spectral linewidth is narrowed as described above is referred to as a line narrowed laser apparatus.

Further, as a laser apparatus for an exposure device, a solid-state laser apparatus may be used from a viewpoint of energy saving. A solid-state laser apparatus includes a semiconductor laser, a nonlinear crystal, and the like.

CITATION LIST

Patent Literature

Patent Literature 1: Japanese Patent No. 4729093
Patent Literature 2: Japanese Patent No. 5225715
Patent Literature 3: U.S. Pat. No. 6,859,335
Patent Literature 4: International Publication No. WO 2015/117849
Patent Literature 5: Japanese Patent Application Laid-Open No. 2015-129855

SUMMARY

A wavelength converting apparatus according to one aspect of the present disclosure may include a moving device. The moving device may include (A) a crystal holder and (B) a driving unit. (A) The crystal holder may be configured to hold a nonlinear crystal for converting a wavelength of laser light made incident on the nonlinear crystal and outputting the laser light. (B) The driving unit may include a voice coil motor, and may be configured to move the crystal holder at least in a direction orthogonal to a first direction that is an optical path axis direction of the laser light.

BRIEF DESCRIPTION OF THE DRAWINGS

Some embodiments of the present disclosure will be described below as just examples with reference to the accompanying drawings.

FIG. 7 is a cross-sectional view illustrating cross sections of third and fourth voice coil motors;

FIG. 9A is a cross-sectional view illustrating an initial state before a yoke and a crystal holder move in an H axis direction, and FIG. 9B is a cross-sectional view illustrating a state where the yoke and the crystal holder moved in the H axis direction;

FIG. 16 is a cross-sectional view of a moving device according to a first modification; and FIG. 17 is a cross-sectional view of a moving device according to a second modification.

EMBODIMENTS

Contents

1. Comparative example
   1.1 Configuration
   1.2 Operation
   1.3 Problem
2. First embodiment
   2.1 Configuration
   2.2 Operation
   2.3 Effect
3. Modification
4. Second embodiment
   4.1 Configuration and operation
   4.2 Effect
5. Modification
6. Third embodiment
   6.1 Configuration and operation
   6.2 Effect
7. Fourth embodiment
   7.1 Configuration and operation
   7.2 Effect
8. Modifications of moving device
   8.1 First modification
   8.2 Second modification Hereinafter, embodiments of the present disclosure will be described in detail with reference to the drawings. The embodiments described below illustrate some examples of the present disclosure, and do not limit the contents of the present disclosure. All of the configurations and the operations described in the embodiments are not always indispensable as configurations and operations of the present disclosure. The same constituent elements are denoted by the same reference signs, and overlapping description is omitted.

1. Comparative Example 1.1 Configuration

Figure 1:
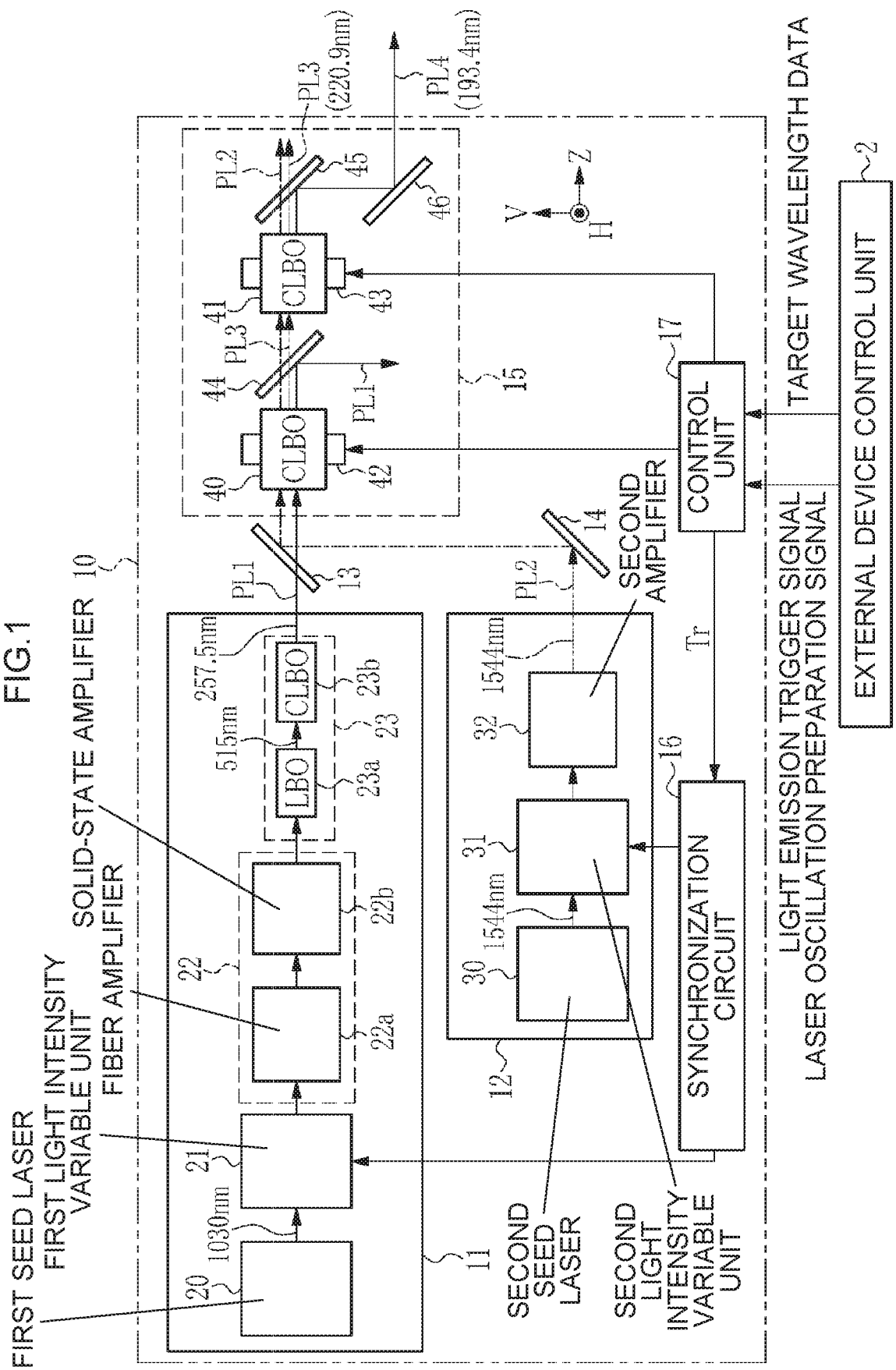
FIG. 1 schematically illustrates a configuration of a solid-state laser system according to a comparative example.

FIG. 1 schematically illustrates a configuration of a solid-state laser system 10 according to a comparative example. In FIG. 1, the solid-state laser system 10 includes a first solid-state laser apparatus 11, a second solid-state laser apparatus 12, a dichroic mirror 13, a high reflective mirror 14, a wavelength conversion system 15, a synchronization circuit 16, and a control unit 17.

The first solid-state laser apparatus 11 includes a first seed laser 20, a first light intensity variable unit 21, a first amplifier 22, and a wavelength conversion unit 23.

The first amplifier 22 includes a fiber amplifier 22a, a solid-state amplifier 22b, and a CW (continuous wave) excitation semiconductor laser not illustrated. The wavelength conversion unit 23 includes a LBO ($LiB_3O_5$) crystal 23a and a CLBO ($CsLiB_6O_{10}$) crystal 23b. The LBO crystal 23a and the CLBO crystal 23b are nonlinear crystals.

The first seed laser 20 is in a single longitudinal mode, and outputs CW light or pulse light having a wavelength of about 1030 nm as first seed light. The first seed laser 20 is a semiconductor laser of distributed feedback type. The first light intensity variable unit 21 includes a semiconductor element on which the first seed light from the first seed laser 20 is made incident. Pulse electric current is applied to the semiconductor element by a current flow control unit, not illustrated, so that the first light intensity variable unit 21 converts the first seed light into laser light having a predetermined pulse width. Hereinafter, the first seed light converted by the first light intensity variable unit 21 is referred to as first seed pulse light.

The fiber amplifier 22a is configured such that Yb-doped quartz fibers are connected in multiple stages. The solid-state amplifier 22b is a Yb-doped YAG (Yttrium Aluminum Garnet) crystal. The fiber amplifier 22a and the solid-state amplifier 22b are optically excited by CW excitation light input from a CW excitation semiconductor laser not illustrated. The first amplifier 22 amplifies first seed pulse light made incident from the first light intensity variable unit 21.

The wavelength conversion unit 23 converts the first seed pulse light amplified by the first amplifier 22 to a higher harmonic, and outputs it as first pulse laser light PL1. Specifically, the wavelength conversion unit 23 includes the LBO crystal 23a and the CLBO crystal 23b. Accordingly, it converts the first seed pulse light to generate a fourth harmonic having a wavelength of about 257.5 nm, and outputs the fourth harmonic as the first pulse laser light PL1.

The second solid-state laser apparatus 12 includes a second seed laser 30, a second light intensity variable unit 31, and a second amplifier 32. The second amplifier 32 includes an Er fiber amplifier not illustrated in which a plurality of quartz fibers, doped with Er and Yb, are connected in multiple stages, and a CW excitation semiconductor laser not illustrated.

The second seed laser 30 is in a single longitudinal mode, and outputs CW light or pulse light having a wavelength of about 1554 nm as second seed light. The second seed laser 30 is a semiconductor laser of distributed feedback type, for example. The second light intensity variable unit 31 includes a semiconductor element on which the second seed light is made incident from the second seed laser 30. Pulse electric current is applied to the semiconductor element by a current flow control unit, not illustrated, so that the second light intensity variable unit 31 converts the second seed light into laser light having a predetermined pulse width. Hereinafter, the second seed light converted by the second light intensity variable unit 31 is referred to as second seed pulse light.

The Er fiber amplifier included in the second amplifier 32 is optically excited by CW excitation light input from a CW excitation semiconductor laser not illustrated. The second amplifier 32 amplifies the second seed pulse light made incident from the second light intensity variable unit 31. The second amplifier 32 outputs the amplified second seed pulse light as second pulse laser light PL2.

The dichroic mirror 13 is disposed at a position on which the first pulse laser light PL1 output from the first solid-state laser apparatus is made incident. The high reflective mirror 14 is disposed such that the second pulse laser light PL2 output from the second solid-state laser apparatus 12 is highly reflected, and that the highly-reflected second pulse laser light PL2 is made incident on the dichroic mirror 13.

The dichroic mirror 13 is coated with a film that highly transmits the first pulse laser light PL1 having a wavelength of about 257.5 nm and highly reflects the second pulse laser light PL2 having a wavelength of about 1,554 nm. The dichroic mirror 13 is disposed such that the optical path axis of the highly-transmitted first pulse laser light PL1 and the optical path axis of the highly-reflected second pulse laser light PL2 match.

The wavelength conversion system 15 includes a first CLBO crystal 40, a second CLBO crystal 41, a first moving device 42, a second moving device 43, a first dichroic mirror 44, a second dichroic mirror 45, and a high reflective mirror 46. The first CLBO crystal 40 and the second CLBO crystal 41 are nonlinear crystals.

The first CLBO crystal 40, the first dichroic mirror 44, the second CLBO crystal 41, and the second dichroic mirror 45 are disposed in this order on the optical paths of the first pulse laser light PL1 and the second pulse laser light PL2.

On the first CLBO crystal 40, the first pulse laser light PL1 and the second pulse laser light PL2 are made incident.

In the first CLBO crystal 40, the first pulse laser light PL1 and the second pulse laser light PL2 overlap each other, whereby third pulse laser light PL3 having a wavelength of about 220.9 nm, corresponding to the sum frequency of the wavelength of about 257.5 nm and the wavelength of about 1,554 nm, is generated. The first pulse laser light PL1 and the second pulse laser light PL2 pass through the first CLBO crystal 40.

The first dichroic mirror 44 is coated with a film that highly reflects the first pulse laser light PL1 and highly transmits the second pulse laser light PL2 and the third pulse laser light PL3. The second pulse laser light PL2 and the third pulse laser light PL3 passing through the first dichroic mirror 44 are made incident on the second CLBO crystal 41.

In the second CLBO crystal 41, the second pulse laser light PL2 and the third pulse laser light PL3 overlap each other, whereby fourth pulse laser light PL4 having a wavelength of about 193.4 nm, corresponding to the sum frequency of the wavelength of about 1,554 nm and the wavelength of about 220.9 nm, is generated. The second pulse laser light PL2 and the third pulse laser light PL3 pass through the second CLBO crystal 41.

The second dichroic mirror 45 is coated with a film that highly reflects the fourth pulse laser light PL4 and highly transmits the second pulse laser light PL2 and the third pulse laser light PL3. The high reflective mirror 46 is disposed at a position such that the fourth pulse laser light PL4, highly reflected by the second dichroic mirror 45, is highly reflected and is output from the wavelength conversion system 15.

The first moving device 42 holds and moves the first CLBO crystal 40.

Figure 2:
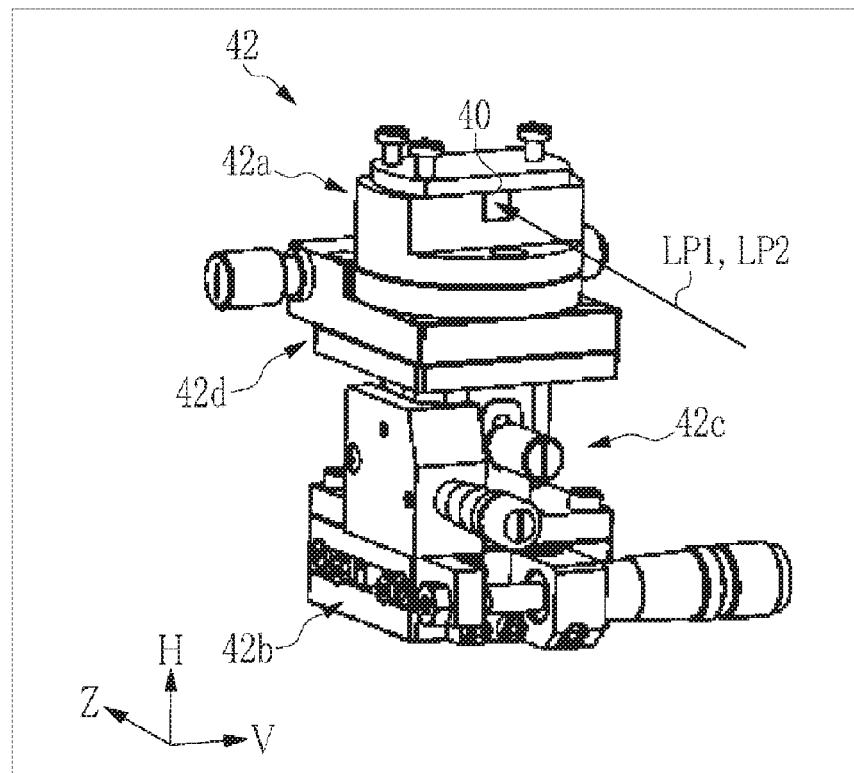
FIG. 2 is a perspective view illustrating a first moving device.

Specifically, as illustrated in FIG. 2, the first moving device 42 includes a crystal holder 42a, a V stage 42b, an H stage 42c, and a θ stage 42d. The crystal holder 42a holds the first CLBO crystal 40 detachably. The V stage 42b moves the H stage 42c, the θ stage 42d, and the crystal holder 42a, which are mounted on the V stage 42b, in the V axis direction. The H stage 42c moves the θ stage 42d and the crystal holder 42a, which are mounted thereon, in the H axis direction. The θ stage 42d turns the crystal holder 42a mounted thereon in the θ direction around the H axis. This means that the first moving device 42 performs linear driving in the V axis direction and the H axis direction and rotary driving in the θ direction.

The H axis, the V axis, and the Z axis are orthogonal to each other. The Z axis direction is an optical path axis direction of the first and second pulse laser light PL1 and PL2 made incident on the wavelength conversion system 15. The H axis direction is a vertical direction, for example. The V stage 42b, the H stage 42c, and the θ stage 42d are driving units each including a stepping motor not illustrated.

The second moving device 43 holds and moves the second CLBO crystal 41.

The configuration of the second moving device 43 is similar to the configuration of the first moving device illustrated in FIG. 2. The second moving device 43 performs linear driving in the V axis direction and the H axis direction and rotary driving in the θ direction.

The control unit 17 is electrically connected with the first and second moving devices 42 and 43, and controls movement of the first and second moving devices 42 and 43. The control unit 17 is also electrically connected with the synchronization circuit 16. The synchronization circuit 16 is electrically connected with the first and second light intensity variable units 21 and 31. The synchronization circuit 16 controls the first and second light intensity variable units 21 and 31 based on a trigger signal Tr input from the control unit 17, and synchronizes the generation timing of first and second seed pulse light. The control unit 17 is also electrically connected with the first and second seed lasers 20 and 30, and respective CW excitation semiconductor lasers included in the first and second amplifiers 22 and 32, via signal lines not illustrated.

The control unit 17 receives a laser oscillation preparation signal, a light emission trigger signal, and target wavelength data from an external device control unit 2 included in an exposure device not illustrated, and controls the first and second moving devices 42 and 43, the synchronization circuit 16, the first and second seed lasers 20 and 30, and the like.

1.2 Operation

Next, operation of the solid-state laser system 10 according to the comparative example will be described. When the control unit 17 receives a laser oscillation preparation signal from the external device control unit 2, the control unit 17 allows the first and second seed lasers 20 and 30 and the respective CW excitation semiconductor lasers included in the first and second amplifiers 22 and 23 to start oscillation operation.

Thereby, first seed light is output from the first seed laser 20, and is input to the first light intensity variable unit 21. Until a control signal described below is input to the first light intensity variable unit 21, amplification of the first seed light is suppressed by the first light intensity variable unit 21. Similarly, second seed light is output from the second seed laser 30, and is input to the second light intensity variable unit 31. Until a control signal described below is input to the second light intensity variable unit 31, amplification of the second seed light is suppressed by the second light intensity variable unit 31. Further, the first and second amplifiers 22 and 32 are optically excited respectively by CW excitation light input from CW excitation semiconductor lasers not illustrated.

When the control unit 17 receives a light emission trigger signal from the external device control unit 2, the control unit 17 transmits a trigger signal Tr to the synchronization circuit 16. When the synchronization circuit 16 receives the trigger signal Tr, it transmits a control signal to the first and second light intensity variable units 21 and 31. When the first light intensity variable unit 21 receives the control signal, the first light intensity variable unit 21 amplifies the first seed light for a predetermined period to thereby generate first seed pulse light having a predetermined pulse width, and makes the light incident on the first amplifier 22. Similarly, when the second light intensity variable unit 31 receives the control signal, the second light intensity variable unit 31 amplifies the second seed light for a predetermined period to thereby generate second seed pulse light having a predetermined pulse width, and makes the light incident on the second amplifier 32.

When the first seed pulse light and the second seed pulse light are made incident on the first and second amplifiers 22 and 32, respectively, the first seed pulse light and the second seed pulse light are amplified due to stimulated emission. The first seed pulse light amplified by the first amplifier 22 is made incident on the wavelength conversion unit 23. The first seed pulse light made incident on the wavelength conversion unit 23 is converted into a fourth harmonic, and is output from the first solid-state laser apparatus 11 as the first pulse laser light PL1. Meanwhile, the second seed pulse light amplified by the second amplifier 32 is output from the second solid-state laser apparatus 12 as the second pulse laser light PL2.

The first pulse laser light PL1 output from the first solid-state laser apparatus 11 is highly transmitted by the dichroic mirror 13 and is made incident on the wavelength conversion system 15. The second pulse laser light PL2 output from the second solid-state laser apparatus 12 is highly reflected by the high reflective mirror 14, and is highly reflected by the dichroic mirror 13 to thereby be made incident on the wavelength conversion system 15.

The synchronization circuit 16 regulates the input timing of the control signals input to the first and second light intensity variable units 21 and 31 such that the first pulse laser light PL1 and the second pulse laser light PL2 made incident on the wavelength conversion system 15 are made incident on the first CLBO crystal 40 almost simultaneously.

When the first pulse laser light PL1 and the second pulse laser light PL2 overlap each other on the first CLBO crystal 40, third pulse laser light PL3 is generated. The third pulse laser light PL3 is sum frequency light of the first pulse laser light PL1 and the second pulse laser light PL2. The first pulse laser light PL1 having passed through the first CLBO crystal 40 is highly reflected by the first dichroic mirror 44. The second pulse laser light PL2 and the third pulse laser light PL3 having passed through the first CLBO crystal 40 are highly transmitted by the first dichroic mirror 44 and are made incident on the second CLBO crystal 41.

When the second pulse laser light PL2 and the third pulse laser light PL3 overlap each other on the second CLBO crystal 41, fourth pulse laser light PL4 is generated. The fourth pulse laser light PL4 that is sum frequency light of the second pulse laser light PL2 and the third pulse laser light PL3. The second pulse laser light PL2 and the third pulse laser light PL3 having passed through the second CLBO crystal 41 are highly transmitted by the second dichroic mirror 45. Meanwhile, the fourth pulse laser light PL4 is highly reflected by the second dichroic mirror 45, and further, highly reflected by the high reflective mirror 46, to thereby be output from the wavelength conversion system 15.

The fourth pulse laser light PL4 output from the wavelength conversion system 15 is output from the solid-state laser system 10, and after being amplified by an ArF excimer amplifier not illustrated, is input to an exposure device not illustrated and is used as exposure light.

Each time the control unit 17 receives a light emission trigger signal from the external device control unit 2, the control unit 17 transmits the trigger signal Tr to the synchronization circuit 16. Thereby, the fourth pulse laser light PL4 is repeatedly output from the solid-state laser system 10.

The control unit 17 counts the number of times of receiving the light emission trigger signals from the external device control unit 2. Each time the count value (the number of shots) reaches the predetermined number of times, the control unit 17 operates the first and second moving devices 42 and 43 to linearly drive them in a direction orthogonal to the optical path axis direction of the laser light. Specifically, the control unit 17 moves the first and second CLBO crystals 40 and 41 by a predetermined distance in at least one of the V axis direction and the H axis direction. This is performed to reduce damages caused by continuous incidence of ultraviolet pulse laser light on particular portions of the first and second CLBO crystals 40 and 41 or continuous generation of ultraviolet wavelength conversion light. Thereby, the crystal lives of the first and second CLBO crystals 40 and 41 can be elongated.

The control unit 17 also changes the oscillation wavelength of the first seed laser 20 or the second seed laser 30, according to the target wavelength data received from the external device control unit 2. The control unit 17 also operates the first and second moving devices 42 and 43 to turn them in the θ direction, according to the target wavelength data. Specifically, the control unit 17 turns the first CLBO crystal 40 and the second CLBO crystal 41 such that the incident angle of the laser light made incident on the first and second CLBO crystals 40 and 41 becomes a phase matching angle corresponding to the target wavelength. Thereby, even when the target wavelength is changed, the incident angle of the laser light always matches the phase matching angle, so that sum frequency light having high intensity is generated in the first CLBO crystal 40 and the second CLBO crystal 41.

1.3 Problem

Figure 3:
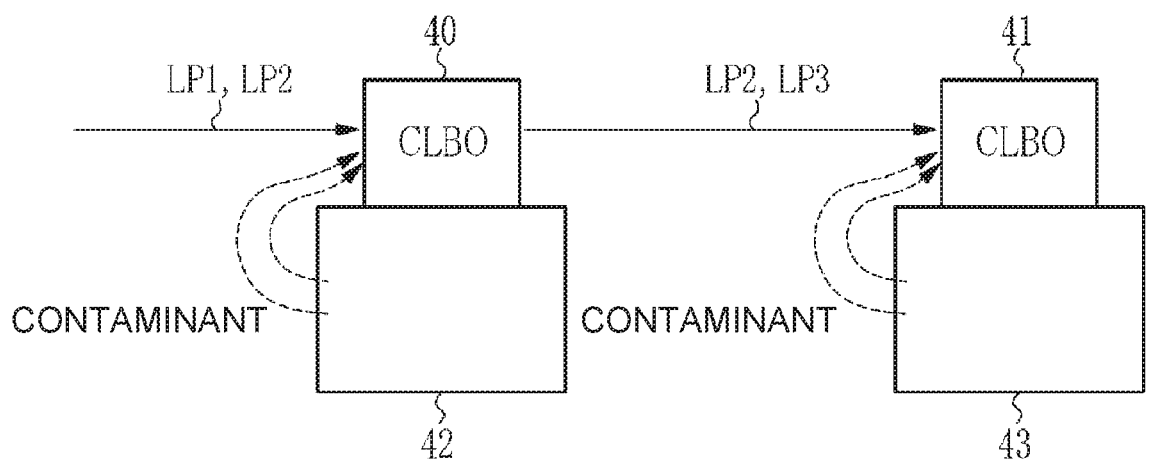
FIG. 3 is a diagram illustrating a problem in the solid-state laser system according to the comparative example.

FIG. 3 illustrates a problem in the solid-state laser system 10 according to the comparative example. Each of the first and second moving devices 42 and 43 has a driving unit including a stepping motor as described above. The stepping motor includes mechanical components such as a gear. Accordingly, in order to reduce friction or the like between mechanical components, a lubricating material containing an organic matter such as oil is applied. Therefore, when the organic matter contained in the lubricating material is discharged as outgas, or the outgas is photolyzed by ultraviolet pulse laser light, the first and second CLBO crystals 40 and 41 may be contaminated.

Specifically, as illustrated in FIG. 3, the outgas discharged from the respective driving units in the first and second moving devices 42 and 43 may be photolyzed by the ultraviolet pulse laser light, and may be attached to the surfaces of the first CLBO crystal 40 and the second CLBO crystal 41 as a contaminant. When the crystal is irradiated with laser light in a state where a contaminant is attached to the crystal surface, a drop in the laser light transmittance or a damage on the crystal surface is caused, resulting in deterioration in the operation performance of the solid-state laser system 10.

2. First Embodiment

Next, a solid-state laser apparatus according to a first embodiment of the present disclosure will be described. A solid-state laser apparatus according to the first embodiment has a configuration that is the same as the configuration of the solid-state laser apparatus of the comparative example illustrated in FIG. 1 except for the configuration of a moving device included in a wavelength conversion system as a wavelength converting apparatus. In the below description, components that are almost similar to the constituent elements of the solid-state laser apparatus of the comparative example illustrated in FIG. 1 are denoted by the same reference signs and the description thereof may be omitted as appropriate.

2.1 Configuration

Figure 4:
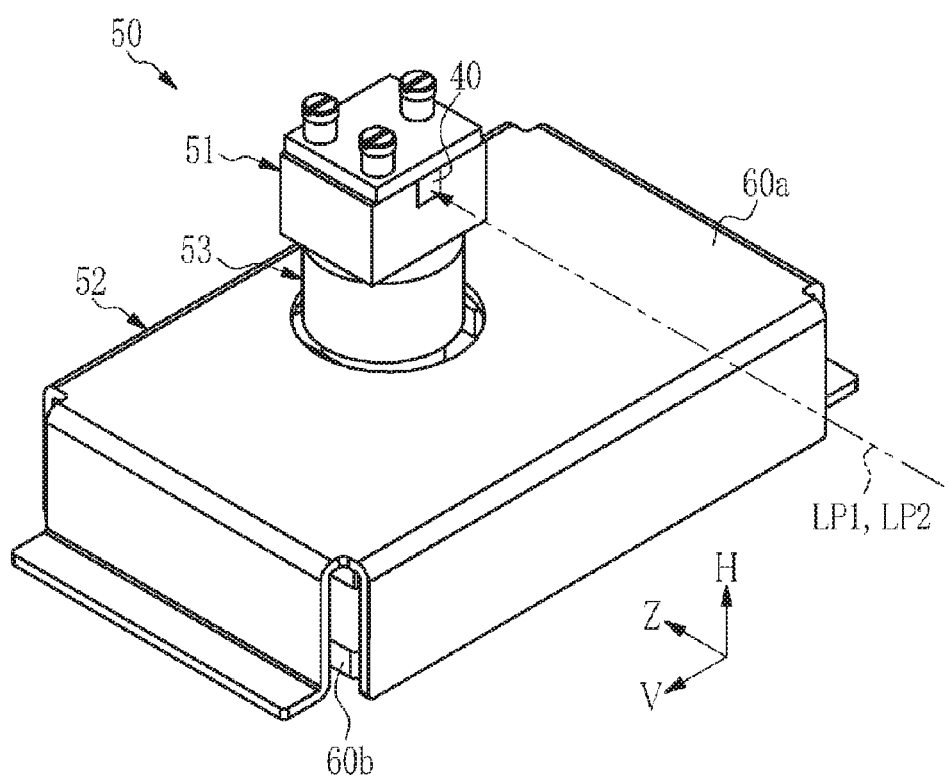
FIG. 4 is a perspective view illustrating an outer appearance of a moving device according to the first embodiment.

FIG. 4 is a perspective view illustrating an outer appearance of a moving device used in the first embodiment in place of the first and second moving devices 42 and 43 of the comparative example. The moving device 50 illustrated in FIG. 4 holds and moves the first CLBO crystal 40. The moving device that holds and moves the second CLBO crystal 41 has a similar configuration.

The moving device 50 includes a crystal holder 51, and a two-dimensional driving unit 52 and a one-dimensional driving unit 53 as driving units. The crystal holder 51 holds the first CLBO crystal 40 detachably. The two-dimensional driving unit 52 is a driving stage that enables linear movement and rotary movement in a VZ plane. Specifically, the two-dimensional driving unit 52 performs linear driving of the one-dimensional driving unit 53 and the crystal holder 51 mounted on the two-dimensional driving unit 52 in the V axis direction, and rotary driving of the one-dimensional driving unit 53 and the crystal holder 51 in the θ direction around the H axis. The one-dimensional driving unit 53 performs linear driving of the crystal holder 51 mounted thereon in the H axis direction.

The Z direction that is the optical axis direction of laser light corresponds to a first direction of the present disclosure. The V axis direction corresponds to a second direction of the present disclosure. The H axis direction corresponds to a third direction of the present disclosure.

The two-dimensional driving unit 52 includes flat voice coil motors described below, and includes a first yoke 60a and a second yoke 60b. The first and second yokes 60a and 60b are fixed.

Figure 5:
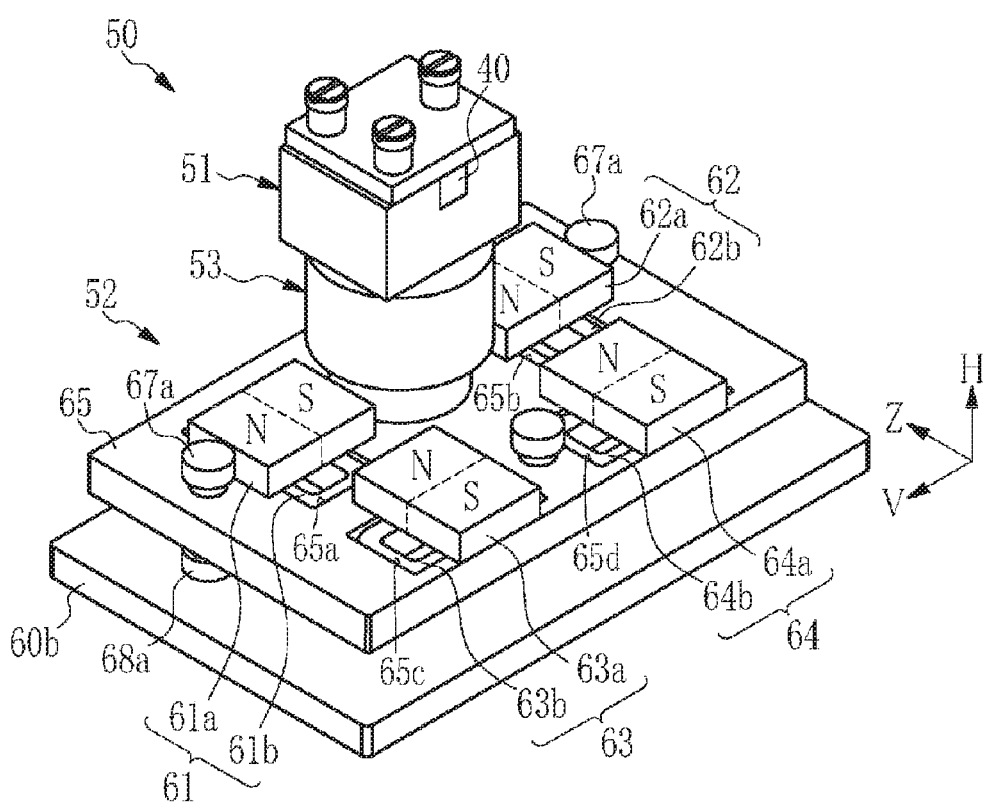
FIG. 5 is a perspective view illustrating a state where a first yoke is removed from the moving device.

FIG. 5 illustrates a state where the first yoke 60a is removed from the moving device 50 in order to explain the configuration of the two-dimensional driving unit 52. In FIG. 5, the moving device 50 includes first to fourth voice coil motors 61 to 64 of the flat coil type, and a movable plate 65. The first voice coil motor 61 includes a magnet 61a and a coil 61b. The second voice coil motor 62 includes a magnet 62a and a coil 62b. The third voice coil motor 63 includes a magnet 63a and a coil 63b. The fourth voice coil motor 64 includes a magnet 64a and a coil 64b.

The magnets 61a to 64a are fixed to the first yoke 60a. The coils 61b to 64b are respectively fixed to holes 65a to 65b formed in the movable plate 65. The magnets 61a to 64a are disposed to face the coils 61b to 64b, respectively. Further, the magnets 61a and 62a included in the first and second voice coil motors 61 and 62 are disposed such that a line linking the N pole and the S pole is in the V axis direction. Meanwhile, the magnets 63a and 64a included in the third and fourth voice coil motors 63 and 64 are disposed such that a line linking the N pole and the S pole is in the Z axis direction. The movable plate 65 is made of a material not having magnetism such as aluminum or the like.

Figure 6:
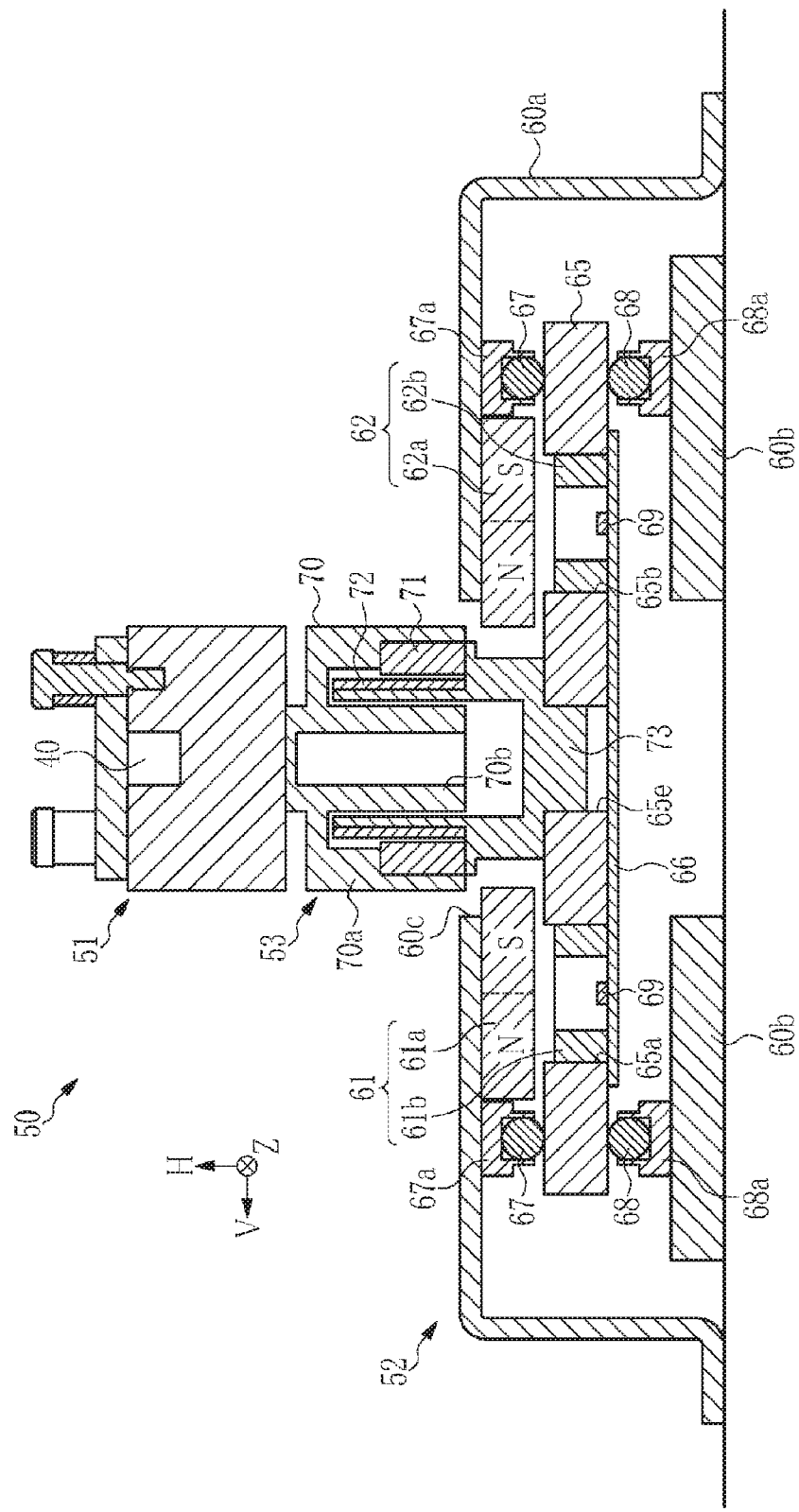
FIG. 6 is a cross-sectional view illustrating cross sections of first and second voice coil motors.

FIG. 6 is a cross-sectional view illustrating a cross section of the moving device 50 cut along the VH plane passing through the first and second voice coil motors 61 and 62 and the one-dimensional driving unit 53. FIG. 7 is a cross-sectional view illustrating a cross section of the moving device 50 cut along the VH plane passing through the third and fourth voice coil motors 63 and 64.

A center portion in the V axis direction of the first yoke 60a has a circular through hole 60c. The one-dimensional driving unit 53 is inserted in the through hole 60c. The first and second voice coil motors 61 and 62 are disposed at symmetrical positions in the V axis direction relative to the Z axis passing through the center of the through hole 60c. Similarly, the third and fourth voice coil motors 63 and 64 are disposed at symmetrical positions in the V axis direction relative to the Z axis passing through the center of the through hole 60c.

The one-dimensional driving unit 53 is a cylindrical voice coil motor, and includes a yoke 70, a magnet 71, a coil 72, and a coil bobbin 73. The coil bobbin 73 is formed in an almost cylindrical shape with the H axis being the center axis. The outer periphery of the upper portion of the coil bobbin 73 is wounded by a coil 72. A lower portion of the coil bobbin 73 is inserted in the circular hole 65e formed in a center portion of the movable plate 65, and is fixed. This means that the one-dimensional driving unit 53 is held by the movable plate 65 of the two-dimensional driving unit 52.

The yoke 70 has a shape in which two cylinders of different diameters are joined in an upper portion, and includes an outer cylindrical part 70a and an inner cylindrical part 70b. To the upper portion of the yoke 70, the crystal holder 51 is fixed. This means that the crystal holder 51 is held by the one-dimensional driving unit 53.

The coil bobbin 73 and the coil 72 are inserted between the outer cylindrical part 70a and the inner cylindrical part 70b. On the inner face of the outer cylindrical part 70a, a cylindrical magnet 71 is fixed at a position facing the coil 72. As the yoke 70 and the coil bobbin 73 are not fixed, the yoke 70 and the magnet 71 are movable in the H axis direction relative to the coil 72 and the coil bobbin 73.

In FIGS. 6 and 7, to a lower portion of the movable plate 65, a circuit board 66 is fixed to cover the holes 65a to 65e. The circuit board 66 is electrically connected with coils 61b to 64b and a coil 72. The circuit board 66 is electrically connected with the control unit 17 via a cable not illustrated. The control unit 17 controls a value and a direction of the electric current flowing through the coils 61b to 64b and the coil 72, via the circuit board 66. Further, on the circuit board 66, a hall sensor 69 is disposed in a center portion of each of the coils 61b to 64b. The hall sensor 69 detects a magnetic field, and outputs a detection signal to the control unit 17 via the circuit board 66.

The movable plate 65 is supported slidably along the VZ plane by three first balls 67 disposed on the first yoke 60a side and three second balls 68 disposed on the second yoke 60b side. Each of the first balls 67 is rotatably fitted in a first ball receiver 67a fixed to the first yoke 60a. Each of the second balls 68 is rotatably fitted in a second ball receiver 68a fixed to the second yoke 60b. The first and second balls 67 and 68 are sliding support members made of a material having a low friction coefficient with respect to the movable plate 65.

2.2 Operation

Next, operation of the moving device 50 in the solid-state laser system according to the first embodiment will be described. Operation other than that of the moving device 50 is similar to the operation described in the comparative example.

Similar to the comparative example, the control unit 17 controls operation of the moving device 50 based on a light emission trigger signal and target wavelength data received from the external device control unit 2. The control unit 17 controls linear movement in the V axis direction and in the H axis direction and rotary movement in the θ direction of the crystal holder 51, by applying electric current that flows through the coils 61b to 64b and the coil 72.

Figure 8A:
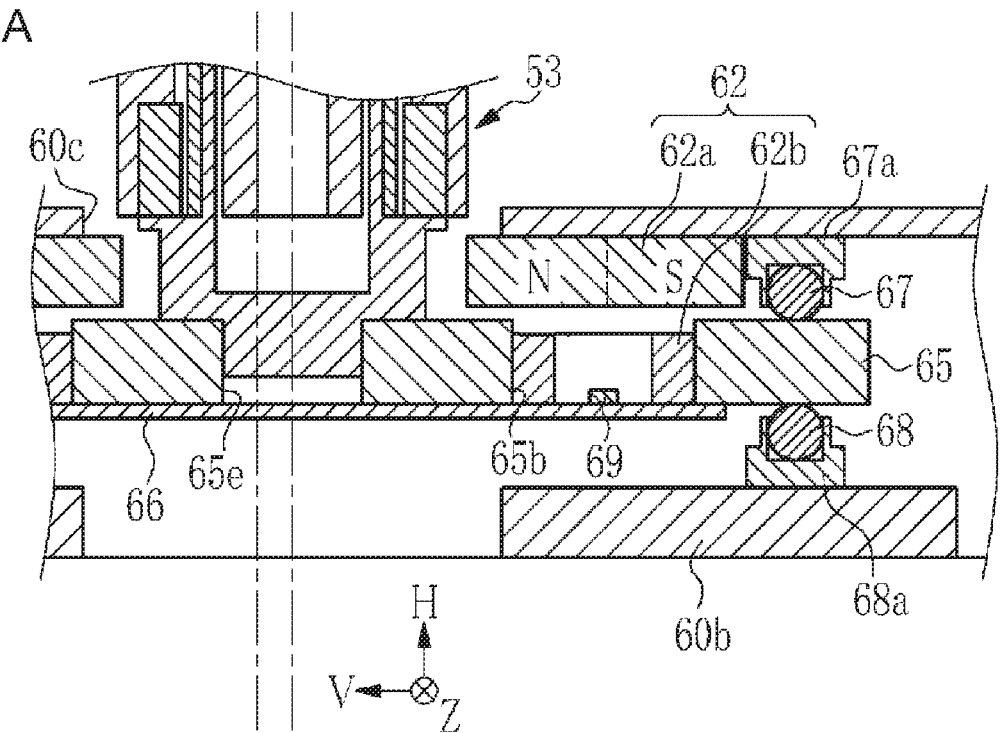
FIG. 8A is a cross-sectional view illustrating an initial state before a movable plate moves in a V axis direction.
Figure 8B:
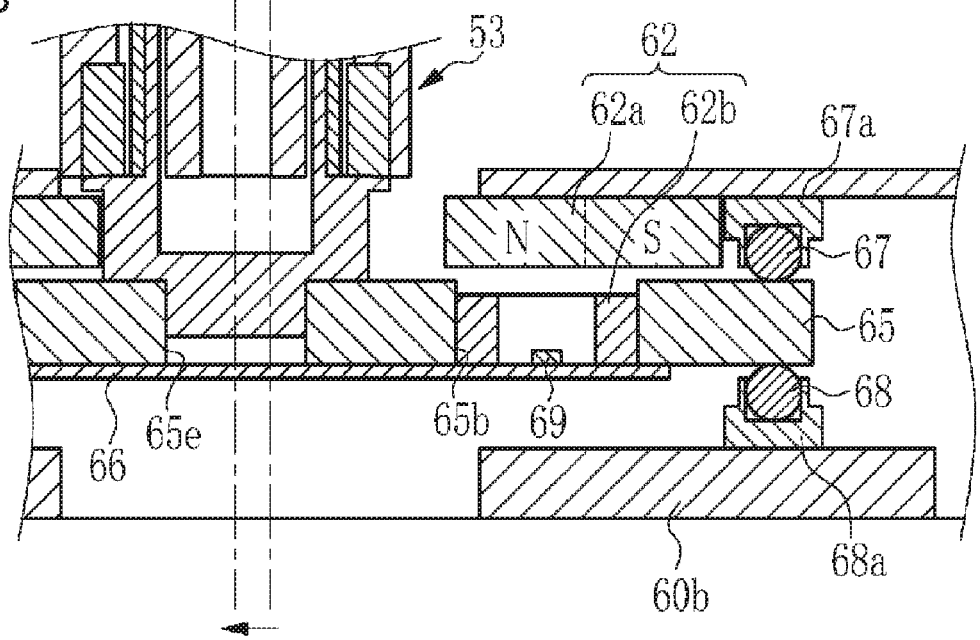
FIG. 8B is a cross-sectional view illustrating a state where the movable plate moved in the V axis direction.

When linearly driving the crystal holder 51 in the V axis direction, the control unit 17 allows electric current to flow in the same direction in the coils 61b and 62b included in the first and second voice coil motors 61 and 62. FIG. 8A illustrates an initial state where electric current does not flow in the coils 61b and 62b. When electric current flows in the coils 61b and 62b, Lorentz force (driving force) is generated in the V axis direction by the electric field generated by the coils 61b and 62b and the magnetic field generated by the magnets 61a and 62a. Thereby, the movable plate 65 moves in the V axis direction, as illustrated in FIG. 8B.

The control unit 17 also detects the position of the movable plate 65 in the V axis direction, based on detection signals output from the hall sensors 69 provided corresponding to the respective coils 61b and 62b. The control unit 17 performs feedback control to control the value of the electric current that flows through the coils 61b and 62b based on the detection position of the movable plate 65, such that the moving amount of the movable plate 65 becomes a predetermined amount. In the case where the moving direction of the movable plate 65 is opposite, the control unit 17 reverses the direction of the electric current that flows through the coils 61b and 62b.

When linearly driving the crystal holder 51 in the H axis direction, the control unit 17 allows electric current to flow through the coil 72 included in the one-dimensional driving unit 53. FIG. 9A illustrates an initial state where electric current does not flow through the coil 72. When electric current flows through the coil 72, Lorentz force (driving force) is generated in the H axis direction by the electric field generated by the coil 72 and the magnetic field generated by the magnet 71. Thereby, the yoke 70 and the crystal holder 51 move in the H axis direction, as illustrated in FIG. 9B.

The control unit 17 controls the value of electric current allowed to flow through the coil 72 such that the moving amount of the crystal holder 51 becomes a predetermined amount. In the present embodiment, a hall sensor is not provided in the one-dimensional driving unit 53. However, a hall sensor that detects a magnetic field of the magnet 71 may be provided in the one-dimensional driving unit 53, and the position of the crystal holder 51 in the H axis direction may be detected based on a detection signal output from the hall sensor. In that case, the control unit 17 may perform feedback control to control the value of the electric current allowed to flow through the coil 72 based on the detection position of the crystal holder 51, such that the moving amount of the crystal holder 51 becomes a predetermined amount.

Figure 10A:
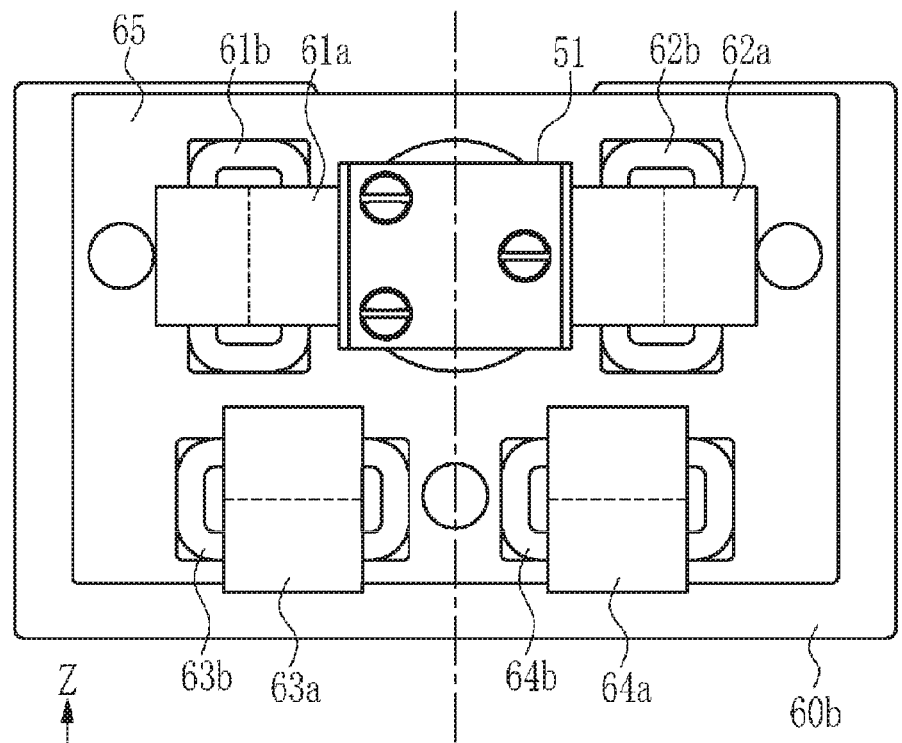
FIG. 10A is a plan view illustrating an initial state before the movable plate turns around the H axis.
Figure 10B:
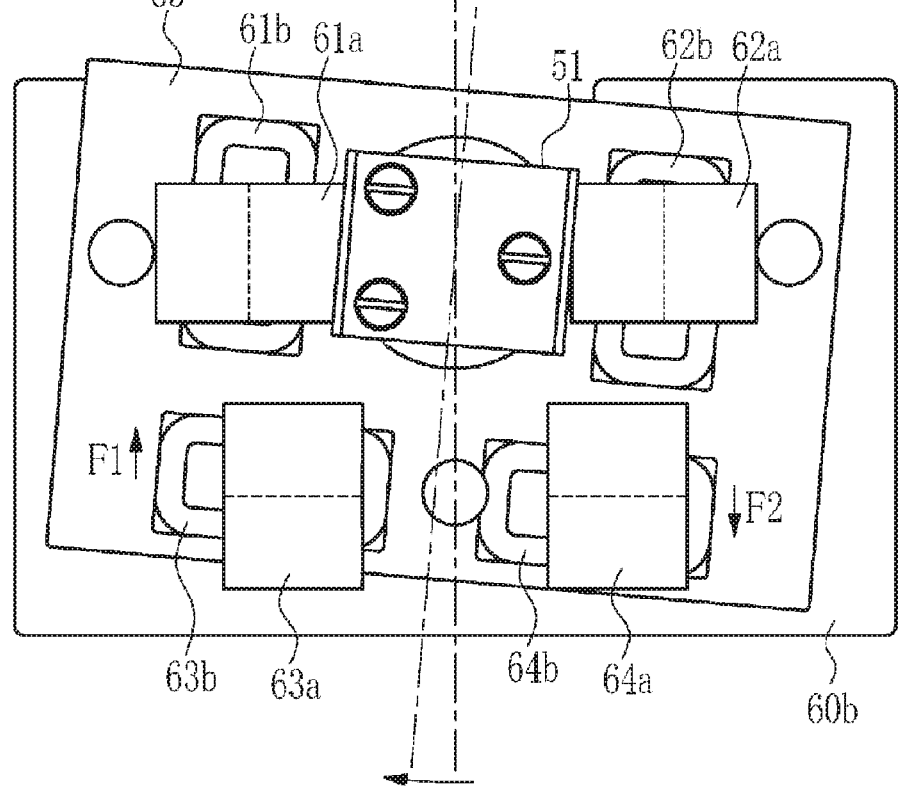
FIG. 10B is a plan view illustrating a state where the movable plate turned around the H axis.

In the case of rotary driving of the crystal holder 51 in the θ direction around the H axis, the control unit 17 allows electric current to flow in the coil 63b included in the third voice coil motor 63 and the coil 64b included in the fourth voice coil motor 64, in opposite directions. FIG. 10A illustrates an initial state where electric current does not flow in the coils 63b and 64b. When electric current flows through the coils 63b and 64b in different directions, in the coil 63b, a driving force F1 is generated in the Z axis direction as illustrated in FIG. 10B, for example. On the other hand, in the coil 64b, a driving force F2 in a direction opposite to the driving force F1 is generated. With the driving forces F1 and F2, a turning force in the θ direction around the H axis is generated in the movable plate 65, whereby the crystal holder 51 is turned in the θ direction.

The control unit 17 also detects the position of the movable plate 65 in the Z axis direction, based on detection signals output from the hall sensors 69 provided corresponding to the respective coils 63b and 64b. The control unit 17 performs feedback control to control the value of the electric current allowed to flow in the coils 63b and 64b based on the detected position of the movable plate 65, such that the moving amount of the movable plate 65 becomes a predetermined amount. In the case where the turning direction of the movable plate 65 is reversed, the control unit 17 reverses the direction of the electric current allowed to flow in the coils 63b and 64b.

The control unit 17 may control the value and the direction of the electric current allowed to flow in the coils 61b to 64b and the coil 72, and thereby move the nonlinear crystal held by the crystal holder 51 in a direction orthogonal to the first direction that is the optical path axis direction of the laser light. Further, the control unit 17 may control the value and the direction of the electric current allowed to flow in the coils 61b to 64b and the coil 72, and thereby turn the crystal holder 51 to change the incident angle of the laser light on the nonlinear crystal.

2.3 Effect

According to the first embodiment, in the moving device 50, driving units are configured by voice coil motors in which mechanical components such as a gear is not used. Accordingly, a lubricant containing oil components which may cause contamination of a nonlinear crystal is not used. Therefore, in the moving device 50, it is possible to suppress generation of a contaminant to be attached to a crystal surface, and to suppress deterioration of operation of the solid-state laser system.

Further, in the moving device 50, since the driving units are configured by the voice coil motors, the movable part is light in weight. Accordingly, the responsiveness is high, and a nonlinear crystal can be moved at high speed. Furthermore, the moving device 50 enables rotary movement in the θ direction around the H axis in addition to the movement in the V axis direction, by the two-dimensional driving unit 52 including a flat voice coil motor. Therefore, the size of the device can be reduced.

While, in the first embodiment, the first and second balls 67 and 68 are used as sliding support members that support the movable plate 65 slidably, it is possible to use another sliding support member or a sliding support mechanism in place of the first and second balls 67 and 68. For example, a portion of the movable plate 65 may be brought into contact with the respective surfaces of the first and second yokes 60a and 60b slidably, without using balls.

Further, in the first embodiment, the first to fourth voice coil motors 61 to 64 are arranged as illustrated in FIG. 2. However, such an arrangement can be changed as appropriate. Further, it is preferable that the direction of the driving force generated in the first and second voice coil motors 61 and 62 and the direction of the driving force generated in the third and fourth voice coil motors 63 and 64 are orthogonal to each other. Furthermore, the moving device 50 may include at least one of the first and second voice coil motors 61 and 62 and at least one of the third and fourth voice coil motors 63 and 64.

3. Modification

Next, a modification of the solid-state laser system according to the first embodiment will be described. In the first embodiment, the movable plate 65 is slidably supported by a sliding support member. In the present modification, the movable plate 65 is energized to a predetermined position by an energizing member, in addition to being supported slidably by a sliding support member.

Figure 11:
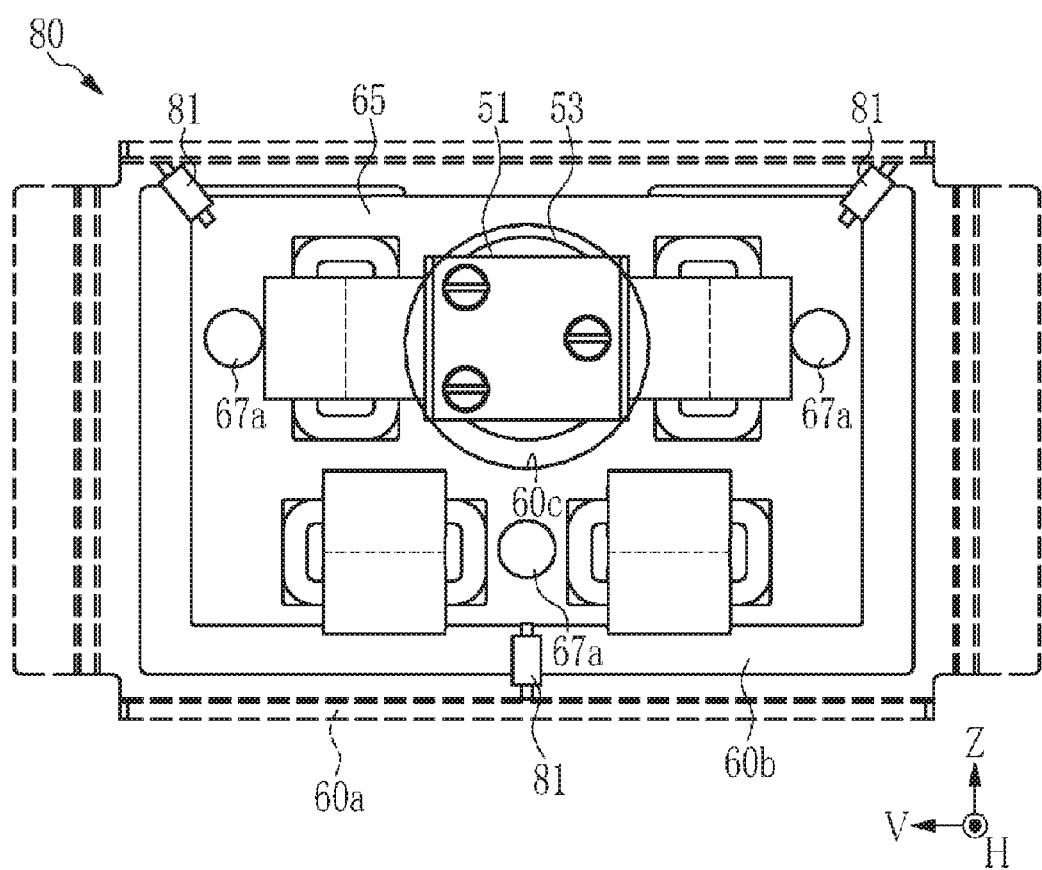
FIG. 11 is a plan view illustrating a moving device according to a modification of the first embodiment.

FIG. 11 is a plan view of a moving device 80 according to the present modification. In FIG. 11, the first yoke 60a is made transparent and is expressed by a broken line. The moving device 80 has the same configuration as that of the moving device 50 according to the first embodiment except for having three springs 81 as energizing members.

Each of the springs 81 is connected between the movable plate 65 and the first yoke 60a. The spring 81 is energized such that the movable plate 65 is positioned at an almost center position in the first yoke 60a. Each of the springs 81 is extended or contracted when the movable plate 65 is moved by the first to fourth voice coil motors 61 to 64.

As described above, by energizing the movable plate 65 by the spring 81, a force to return to the almost center portion in the first yoke 60a is always applied to the movable plate 65. Accordingly, position control by the first to fourth voice coil motors 61 to 64 can be performed easily. Moreover, by energizing the movable plate 65 by the spring 81, it is possible to suppress a case where the movable plate 65 moves to be in contact with the first yoke 60a or the like whereby damage or the like is caused, at the time of carrying the solid-state laser system.

In the present modification, each of the springs 81 is connected with the first yoke 60a. However, each of the springs 81 may be connected with a fixed part such as the second yoke 60b in place of the first yoke 60a. Further, in the present modification, the movable plate 65 is energized with use of three springs 81. However, the number of the springs 81 and the layout positions thereof can be changed as appropriate. Moreover, while the spring 81 is used as an energizing member in the present modification, another energizing member may be used in place of the spring 81.

4. Second Embodiment

Next, a solid-state laser apparatus according to a second embodiment of the present disclosure will be described. According to the first embodiment, while generation of a contaminant from the moving device 50 is suppressed, there is a possibility that a slight amount of outgas may be generated from voice coil motors or abrasion powder may be generated by sliding of the movable plate 65. In the second embodiment, the two-dimensional driving unit 52 and the one-dimensional driving unit 53 of the moving device 50 are sealed in a sealed container. Thereby, adhesion of a contaminant to a nonlinear crystal held by the crystal holder 51 is suppressed.

4.1 Configuration and Operation

Figure 12:
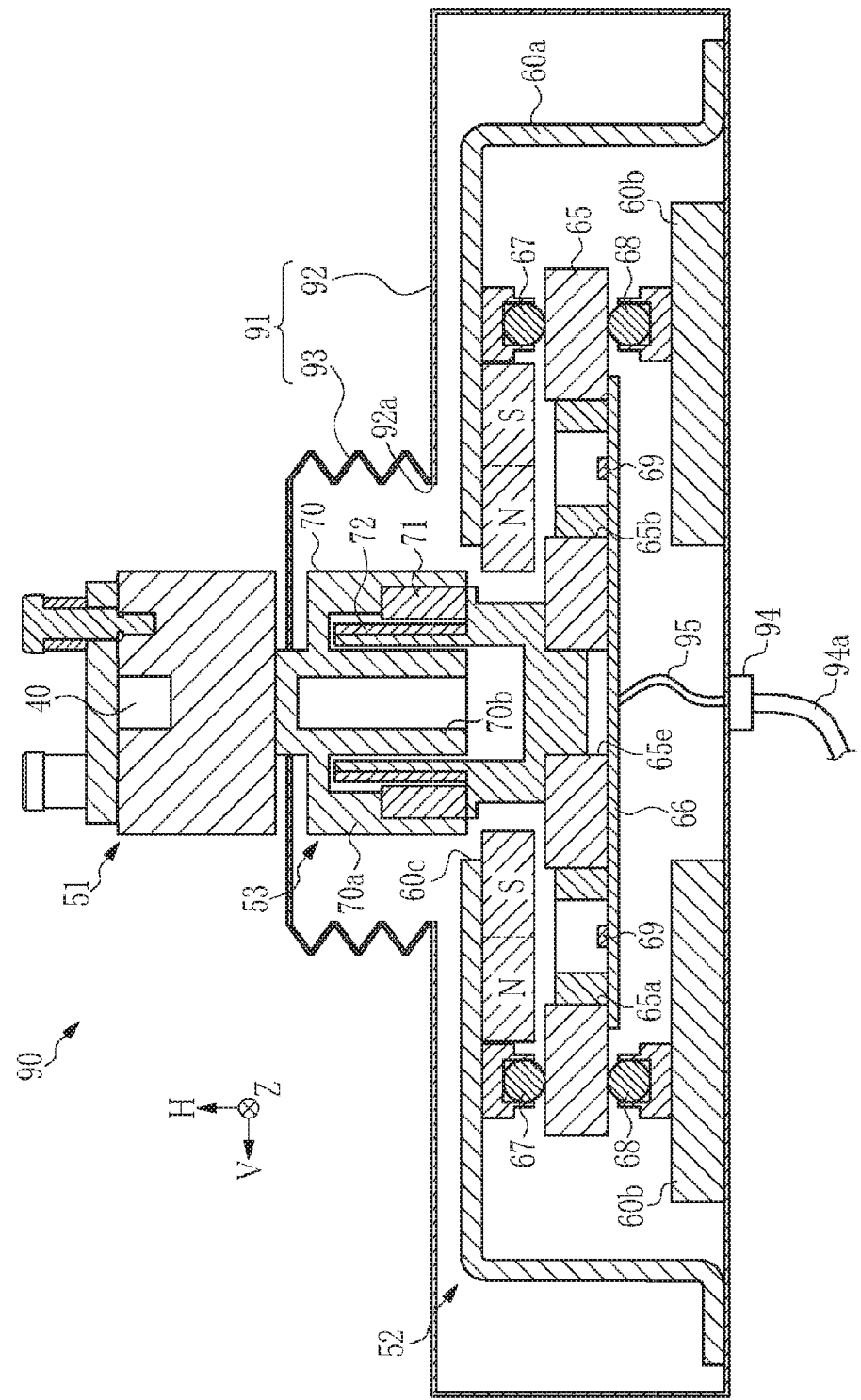
FIG. 12 is a cross-sectional view of a moving device according to a second embodiment.

FIG. 12 is a cross-sectional view of a moving device 90 according to the second embodiment. The moving device 90 includes the crystal holder 51, the two-dimensional driving unit 52, the one-dimensional driving unit 53, and a sealed container 91. The moving device 90 has the same configuration as that of the moving device 50 according to the first embodiment except for having the sealed container 91.

The sealed container 91 includes a box-shaped container body 92 and a bellows 93. The container body 92 accommodates the two-dimensional driving unit 52. The upper surface of the container body 92 has an opening 92a at a position corresponding to the through hole 60c of the first yoke 60a. To the opening 92a, a lower end portion of the bellows 93 is joined by welding or the like. The bellows 93 accommodates the one-dimensional driving unit 53. An upper end portion of the bellows 93 is joined to an upper end portion of a yoke 70 by welding or the like. As described above, the two-dimensional driving unit 52 and the one-dimensional driving unit 53 are sealed in the sealed container 91.

The bellows 93 has an extendable/contractable structure in the H axis direction, and is extended or contracted along with movement of the crystal holder 51 in the H axis direction. The bellows 93 also allows movement of the crystal holder 51 in the V axis direction and rotary movement around the H axis. The bellows 93 is elastically deformed when the crystal holder 51 is moved or turned.

To the bottom surface of the container body 92, a connector 94 having a hermetic sealing structure is connected. The connector 94 is connected with a signal cable 94a connected with the control unit 17. The connector 94 is also connected with a signal line 95 connected with the circuit board 66. As the hermetic sealing structure of the connector 94, a glass hermetic sealing method is used, for example.

4.2 Effect

According to the second embodiment, as the two-dimensional driving unit 52 and the one-dimensional driving unit 53 are sealed in the sealed container 91, the voice coil motors are spatially separated from the nonlinear crystal held by the crystal holder 51. Thereby, it is possible to suppress adhesion of a slight amount of outgas generated from the voice coil motors or abrasion powder caused by sliding of the movable plate 65, to a nonlinear crystal as a contaminant.

While an upper end portion of the bellows 93 is joined to an upper end portion of the yoke 70 in the second embodiment, it may be joined to a lower portion of the crystal holder 51. In that case, it is preferable that the bellows 93 and the crystal holder 51 are joined by brazing.

5. Modification

Next, a modification of the solid-state laser system according to the second embodiment will be described. A CLBO crystal as a nonlinear crystal held by the crystal holder 51 has deliquescency. As such, it is preferable that the CLBO crystal is used in a heated state at a predetermined temperature in order to vaporize moisture contained in the nonlinear crystal. The moving device according to the present modification is configured such that a heater 96 for heating a nonlinear crystal is provided in the crystal holder 51.

Figure 13:
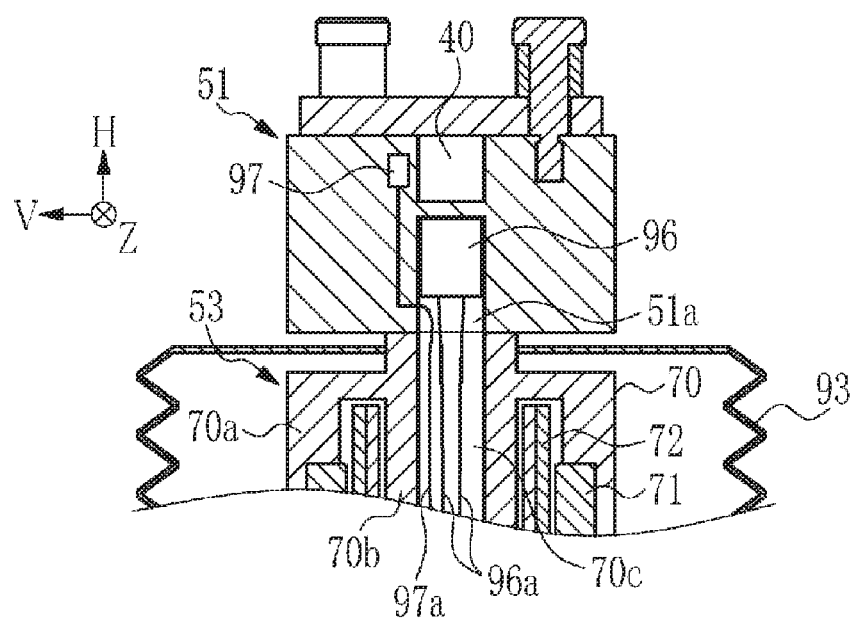
FIG. 13 is a cross-sectional view illustrating a part of a moving device according to a modification of the second embodiment.

In the present modification, as illustrated in FIG. 13, the crystal holder 51 has a hole 51a formed from the bottom surface and reaching a position close to the CLBO crystal 40 as a nonlinear crystal. Further, a through hole 70c is formed at a center portion of the yoke 70 included in the one-dimensional driving unit 53. The hole 51a and the through hole 70c communicate with each other.

The heater 96 is disposed in the hole 51a at a position close to the CLBO crystal 40. The heater 96 is connected with a pair of cables 96a. The cables 96a are inserted in the hole 51a and the through hole 70c, and are connected to the circuit board 66.

In the crystal holder 51, a temperature sensor 97 is embedded at a position close to the CLBO crystal 40. The temperature sensor 97 is connected with a cable 97a. The cable 97a is inserted in the hole 51a and the through hole 70c, and is connected to the circuit board 66. The crystal holder 51 is made of a material having high heat conductance such as copper.

The cables 96a and 97a are inserted inside the yoke 70, the magnet 71, and the coil 72, and are connected with the control unit 17 via the signal line 95, the connector 94, and the signal cable 94a. The control unit 17 electrifies the heater 96 via the cable 96a to thereby control the temperature of the heater 96. The control unit 17 also acquires a detection signal output from the temperature sensor 97 via the cable 97a, and regulates the temperature of the heater 96 such that the detection temperature becomes the target temperature. The target temperature is 150° C. for example.

In the present modification, the heater 96 and the temperature sensor 97 are embedded in the crystal holder 51, and the cables 96a and 97a are inserted in the hole 51a and the through hole 70c. Therefore, it is possible to suppress adhesion of a contaminant, generated from the heater 96 and the temperature sensor 97, to the nonlinear crystal.

The present modification is applicable not only to the second embodiment, but also to the first embodiment. This means that the present modification is also applicable to the moving device 50 not having the sealed container 91.

6. Third Embodiment

Next, a solid-state laser apparatus according to a third embodiment of the present disclosure will be described. In the second embodiment, the two-dimensional driving unit 52 and the one-dimensional driving unit 53 are sealed in the sealed container 91. In the third embodiment, the crystal holder 51 is further surrounded by a chamber to thereby further suppress adhesion of a contaminant to nonlinear crystal.

6.1 Configuration and Operation

Figure 14:
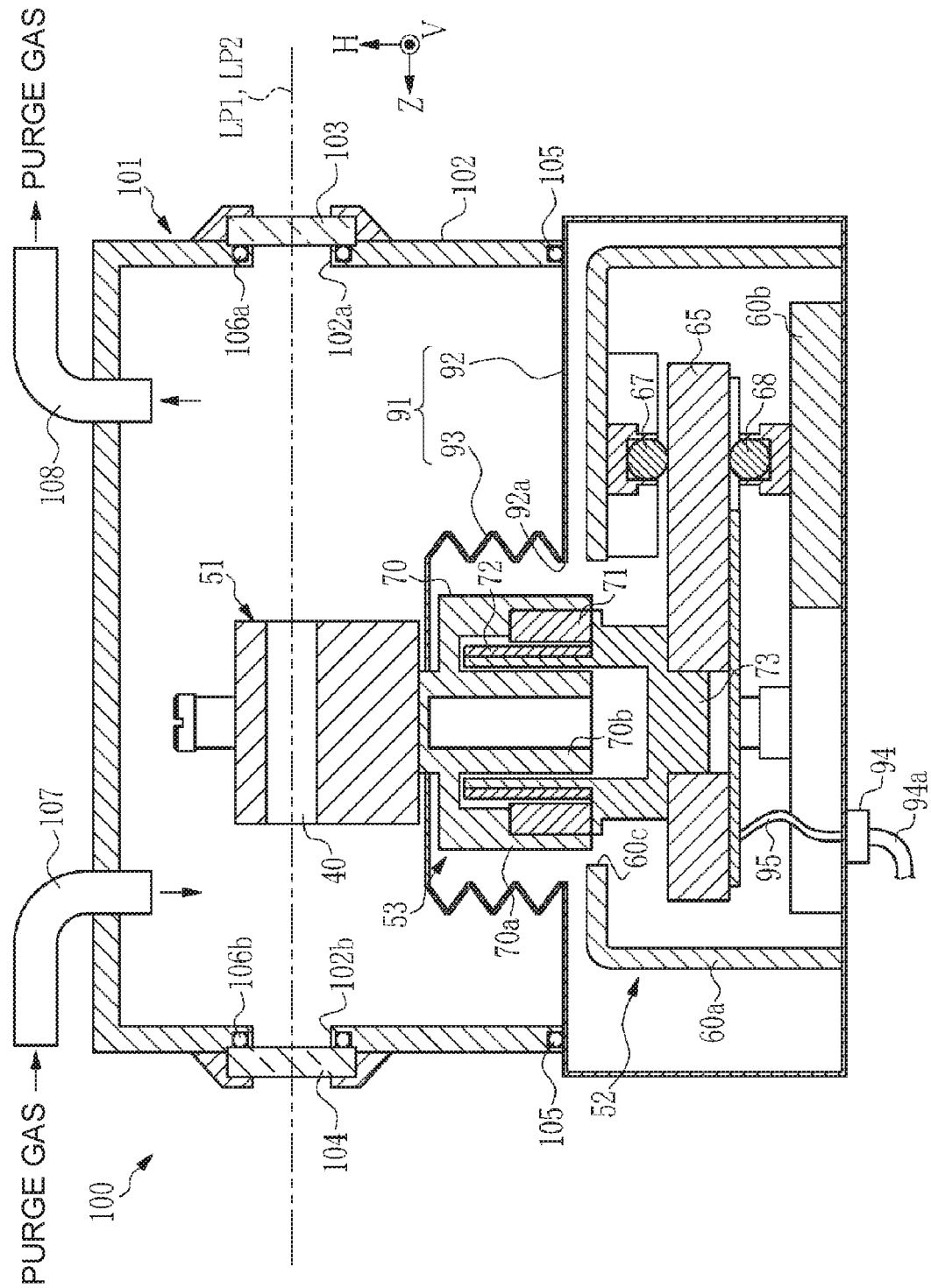
FIG. 14 is a cross-sectional view illustrating a moving device according to a third embodiment.

FIG. 14 is a cross-sectional view of a moving device 100 according to the third embodiment. The moving device 100 includes the crystal holder 51, the two-dimensional driving unit 52, the one-dimensional driving unit 53, the sealed container 91, and a chamber 101. The moving device 100 has the same configuration as that of the moving device 90 according to the second embodiment except for having the chamber 101.

The chamber 101 includes a chamber body 102, an incidence window 103, and an emission window 104. The chamber body 102 is in a box shape with the open bottom. The bottom is joined to the upper surface of the container body 92 of the sealed container 91 via an O ring 105.

The chamber body 102 has an incident side opening 102a formed at a position corresponding to the path of laser light made incident on the CLBO crystal 40. The chamber body 102 also has an emission side opening 102b formed at a position corresponding to the path of laser light emitted from the CLBO crystal 40. The incidence window 103 is joined to the chamber body 102 via the O ring 106a so as to close the incident side opening 102a. The emission window 104 is joined to the chamber body 102 via the O ring 106b so as to close the emission side opening 102b.

The incidence window 103 and the emission window 104 are configured such that both surfaces of a substrate made of $CaF_2$ crystal or synthetic quartz are coated with a reflection suppression film. The incidence window 103 transmits laser light to make it incident on the CLBO crystal 40. The emission window 104 transmits laser light emitted from the CLBO crystal 40.

The chamber body 102 is also connected with a gas introduction pipe 107 for introducing purge gas into the chamber body 102 and a gas discharge pipe 108 for discharging purge gas from the inside of the chamber body 102. The gas introduction pipe 107 is connected with a gas tank not illustrated. The gas discharge pipe 108 discharges purge gas into the atmospheric air. The gas discharge pipe 108 may be connected with an outside air communication pipe not illustrated. Purge gas is a gas that resists chemical reaction with a CLBO crystal as a nonlinear crystal. As the purge gas, it is preferable to use Ar gas or He gas. The purge gas is introduced into the chamber body 102 and is discharged, at an almost constant flow rate.

6.2 Effect

According to the third embodiment, the crystal holder 51 is separated, by the chamber 101, from the two-dimensional driving unit 52 and the one-dimensional driving unit 53 that are generation sources of a contaminant. Accordingly, it is possible to suppress adhesion of a contaminant to the nonlinear crystal. Further, as the chamber 101 is purged with a gas that resists chemical reaction with the nonlinear crystal, it is possible to further suppress adhesion of a contaminant to the nonlinear crystal.

Further, as the chamber 101 is individually provided to one crystal holder 51, there is an advantage that only a small amount of purge gas is used.

While the two-dimensional driving unit 52 and the one-dimensional driving unit 53 are sealed in the sealed container 91 in the third embodiment, the sealed container 91 is not necessarily sealed. A bottom portion or a side face of the container body 92 may have an opening. This is because the crystal holder 51 is separated from the two-dimensional driving unit 52 and the one-dimensional driving unit 53 by the chamber body 102, the bellows 93, and the upper surface of the container body 92, in the third embodiment. This means that it is only necessary that the two-dimensional driving unit 52 and the one-dimensional driving unit 53 are accommodated in a container connected with the chamber body 102 and included in the chamber 101, not limited to the sealed container 91.

7. Fourth Embodiment

Next, a solid-state laser system according to a fourth embodiment of the present disclosure will be described. In the fourth embodiment, the crystal holder 51 is sealed in a cell, whereby adhesion of a contaminant to a nonlinear crystal is suppressed.

7.1 Configuration and Operation

Figure 15:
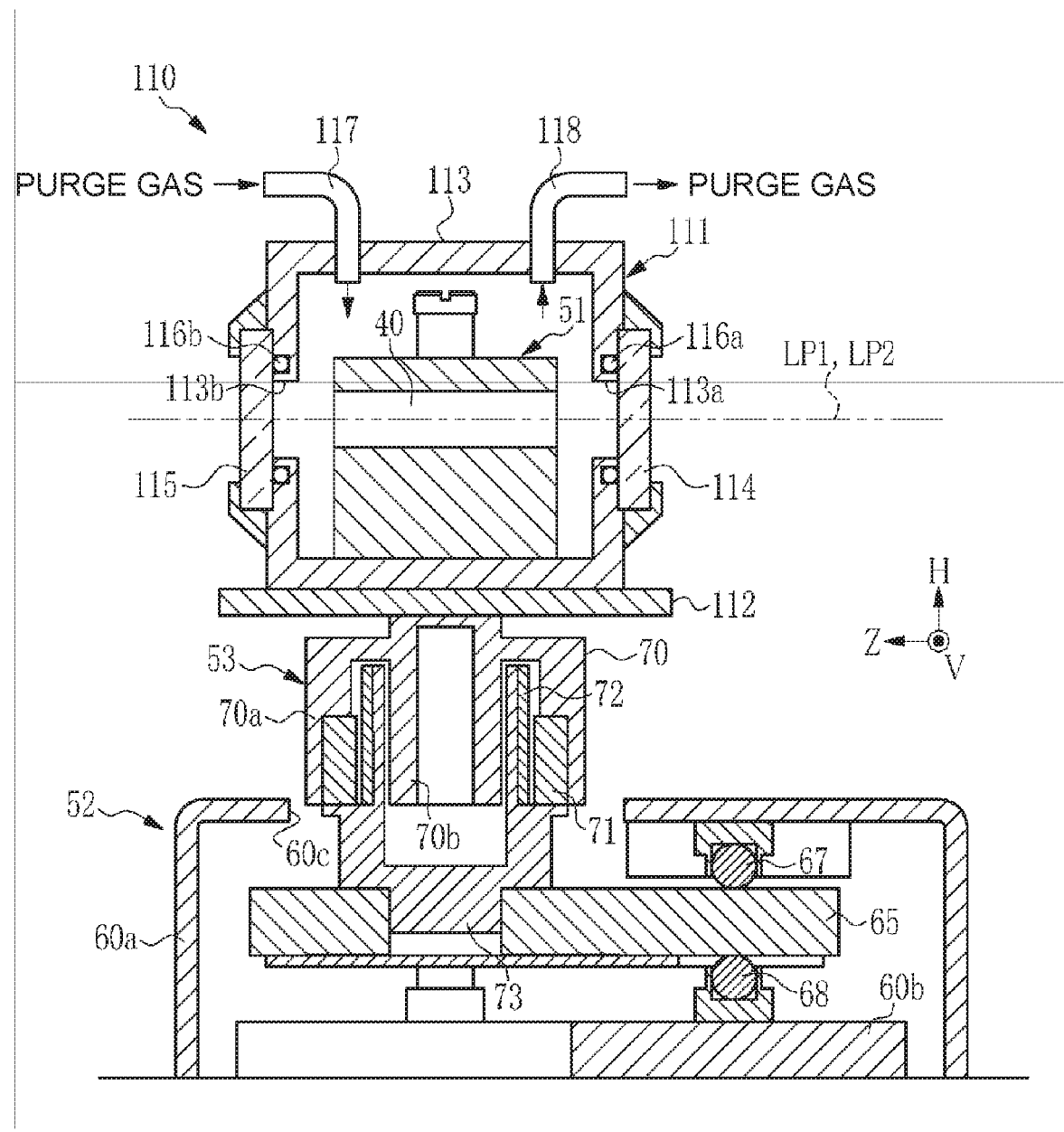
FIG. 15 is a cross-sectional view of a moving device according to a fourth embodiment.

FIG. 15 is a cross-sectional view of a moving device 110 according to the fourth embodiment. The moving device 110 includes the crystal holder 51, the two-dimensional driving unit 52, the one-dimensional driving unit 53, and a cell 111. The moving device 110 has the same configuration as that of the moving device 50 according to the first embodiment except for having the cell 111.

The cell 111 is fixed to a plate 112 provided on the yoke 70 included in the one-dimensional driving unit 53. The cell 111 includes a cell body 113, an incidence window 114, and an emission window 115. The cell 111 is in a box shape, and accommodates the crystal holder 51 therein.

The cell body 113 has an incident side opening 113a formed at a position corresponding to the path of the laser light made incident on the CLBO crystal 40. The cell body 113 also has an emission side opening 113b formed at a position corresponding to the path of the laser light emitted from the CLBO crystal 40. The incidence window 114 is joined to the cell body 113 via an O ring 116a so as to close the incident side opening 113a. The emission window 115 is joined to the cell body 113 via an O ring 116b so as to close the emission side opening 113b.

The incidence window 114 and the emission window 115 are configured such that both surfaces of the substrate made of $CaF_2$ crystal or synthetic quartz are coated with a reflection suppression film. The incidence window 114 transmits laser light to make it incident on the CLBO crystal 40. The emission window 115 transmits laser light emitted from the CLBO crystal 40.

The cell body 113 is also connected with a gas introduction pipe 117 for introducing purge gas into the cell body 113, and a gas discharge pipe 118 for discharging purge gas from the inside of the cell body 113. The gas introduction pipe 117 is connected with a gas tank not illustrated. The gas discharge pipe 118 discharges purge gas into the atmospheric air. The gas discharge pipe 118 may be connected with an outside air communication pipe not illustrated. Purge gas is a gas that resists chemical reaction with a CLBO crystal as a nonlinear crystal. As the purge gas, it is preferable to use Ar gas or He gas. The purge gas is introduced into the cell body 113 and is discharged, at an almost constant flow rate.

The cell 111 is driven along with the crystal holder 51 when the two-dimensional driving unit 52 and the one-dimensional driving unit 53 are operated.

7.2 Effect

According to the fourth embodiment, the crystal holder 51 is isolated from the two-dimensional driving unit 52 and the one-dimensional driving unit 53 that are generation sources of a contaminant. Accordingly, when the inside of the cell 111 is purged with purge gas, it is possible to suppress adhesion of a contaminant to the nonlinear crystal.

In particular, the cell 111 can be smaller in size than the chamber 101 of the third embodiment. Accordingly, the amount of purge gas to be used can be reduced. This is effective because in the case of using a CLBO crystal as nonlinear crystal, it is not preferable to use inexpensive nitrogen gas as purge gas. It is preferable to use expensive Ar gas or He gas that resists chemical reaction with the CLBO crystal.

8. Modifications of Moving Device

In a moving device of each of the first to fourth embodiments, driving units are configured by voice coil motors in which mechanical components such as a gear are not used. As an actuator not using mechanical components such as a gear, a piezoelectric actuator or an ultrasonic motor is known, besides a voice coil motor. In the moving device of each of the embodiments described above, the driving units may be configured by piezoelectric actuators or ultrasonic motors in place of the voice coil motors.

8.1 First Modification

FIG. 16 is a cross-sectional view of a moving device 120 according to a first modification. The moving device 120 includes the crystal holder 51, a six-axial stage unit 121, and a chamber 131. The six-axial stage unit 121 includes a first plate 122, a second plate 123, and six piezoelectric actuators 124.

The crystal holder 51 is fixed on the first plate 122. Each of the piezoelectric actuators 124 is connected between the first plate 122 and the second plate 123.

The piezoelectric actuator 124 includes two stators that are not illustrated and disposed to face each other, and a slider that is not illustrated and disposed between the two stators. The stator includes a piezoelectric element not illustrated. When the voltage and the polarity thereof to be applied to the piezoelectric element are controlled, the piezoelectric actuator 124 extends or contracts. The configuration of the piezoelectric actuator 124 is disclosed in Japanese Patent Application Laid-Open No. 2011-204947.

When the control unit 17 controls extension and contraction of each piezoelectric actuator 124, the first plate 122 and the crystal holder 51 are moved and turned. The six-axial stage unit 121 enables at least linear driving of the crystal holder 51 in the V axis direction and the H axis direction and rotary driving of the crystal holder 51 in the θ direction around the H axis.

The chamber 131 includes a chamber body 132, an incidence window 133, and an emission window 134. The chamber body 132 is in a box shape and accommodates the crystal holder 51 and the six-axial stage unit 121 therein.

The chamber body 132 has an incidence side opening 132a formed at a position corresponding to the path of the laser light made incident on the CLBO crystal 40. The chamber body 132 also has an emission side opening 132b formed at a position corresponding to the path of the laser light emitted from the CLBO crystal 40. The incidence window 133 is joined to the chamber body 132 via an O ring 135a so as to close the incident side opening 132a. The emission window 134 is joined to the chamber body 132 via an O ring 135b so as to close the emission side opening 132b.

The incidence window 133 and the emission window 134 each are configured such that both surfaces of the substrate made of $CaF_2$ crystal or synthetic quartz are coated with a reflection suppression film. The incidence window 133 transmits laser light to make it incident on the CLBO crystal 40. The emission window 134 transmits laser light emitted from the CLBO crystal 40.

The chamber body 132 is also connected with a gas introduction pipe 136 for introducing purge gas into the chamber body 132 and a gas discharge pipe 137 for discharging purge gas from the inside of the chamber body 132. The gas introduction pipe 136 is connected with a gas tank not illustrated. The gas discharge pipe 137 discharges purge gas into the atmospheric air. The gas discharge pipe 137 may be connected with an outside air communication pipe not illustrated. Purge gas is a gas that resists chemical reaction with a CLBO crystal as a nonlinear crystal. As the purge gas, it is preferable to use Ar gas or He gas. The purge gas is introduced into the chamber body 132 and is discharged, at an almost constant flow rate.

The piezoelectric actuator 124 does not include a mechanical component such as a gear, and does not use lubricant containing oil. As such, the amount of generation of a contaminant such as outgas is small. Accordingly, even in the case where the six-axial stage unit 121 is accommodated in the chamber 131, it is possible to suppress adhesion of a contaminant to the nonlinear crystal.

8.2 Second Modification

FIG. 17 is a cross-sectional view of a moving device 140 according to a second modification. The moving device 140 includes the crystal holder 51, an ultrasonic stage unit 141, and the chamber 131. The ultrasonic stage unit 141 includes a θ stage 142, a V stage 143, and an H stage 144. The θ stage 142, the V stage 143, and the H stage 144 are layered in this order from the bottom. The crystal holder 51 is fixed to the H stage 144.

The θ stage 142 is an ultrasonic motor including a rotor, stator, and a plurality of piezoelectric elements that are not illustrated. Each of the V stage 143 and the H stage 144 is an ultrasonic motor including a slider, a stator, and a plurality of piezoelectric elements that are not illustrated.

In the case of operating an ultrasonic motor, pressure is applied to the piezoelectric element to deform the piezoelectric element. The deformation of the piezoelectric element is amplified and propagated in the stator, whereby the surface of the stator is deformed to be in a wave form. The deformation of the surface of the stator moves as a traveling wave, and thereby the rotor in contact with the stator, or the stator is driven. Thereby, the θ stage 142 is turned in the θ direction with the H axis being the center axis. The V stage 143 moves in the V axis direction. The H stage 144 moves in the H axis direction.

The control unit 17 controls the voltage applied to the piezoelectric element included in the ultrasonic motor, and the polarity thereof. Thereby, the control unit 17 enables linear drive of the crystal holder 51 in the V axis direction and the H axis direction and turning drive of the crystal holder 51 in the θ direction with the H axis being the center axis.

The chamber 131 includes the chamber body 132, the incidence window 133, and the emission window 134. The chamber body 132 is in a box shape, and accommodates the crystal holder 51 and the ultrasonic stage unit 141 therein. As the chamber 131 has the same configuration as that described in the first modification, the description thereof is omitted.

The ultrasonic motors included in the θ stage 142, the V stage 143, and the H stage 144 do not include a mechanical component such as a gear, and do not use a lubricant containing oil. As such, the amount of generation of a contaminant such as outgas is small. Accordingly, even in the case where the ultrasonic stage unit 141 is accommodated in the chamber 131, it is possible to suppress adhesion of a contaminant to the nonlinear crystal.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, a modifier "a/an" described in the present description and in the accompanying claims should be construed to mean "at least one" or "one or more".

What is claimed is:

1. A wavelength converting apparatus comprising a moving device including:
   (A) a crystal holder configured to hold a nonlinear crystal for converting a wavelength of laser light made incident on the nonlinear crystal and outputting the laser light; and
   (B) a driving unit including a voice coil motor, the driving unit being configured to move the crystal holder at least in a direction orthogonal to a first direction that is an optical path axis direction of the laser light,
   wherein the driving unit turns the crystal holder to change an incident angle of the laser light on the nonlinear crystal, and
   the driving unit includes:
      a two-dimensional driving unit including a planar voice coil motor as the voice coil motor; and
      a one-dimensional driving unit including a cylindrical voice coil motor as the voice coil motor,
   the two-dimensional driving unit performs linear driving in a second direction orthogonal to the first direction, and rotary driving around a third direction orthogonal to the first direction and the second direction, and
   the one-dimensional driving unit performs linear driving in the third direction.

2. The wavelength converting apparatus according to claim 1, wherein
   the one-dimensional driving unit is held by the two-dimensional driving unit, and
   the crystal holder is held by the one-dimensional driving unit.

3. The wavelength converting apparatus according to claim 2, wherein
   the two-dimensional driving unit includes:
      a first voice coil motor and a second voice coil motor as the voice coil motor, the first voice coil motor and the second voice coil motor each being configured to generate driving forces in the second direction; and
      a third voice coil motor and a fourth voice coil motor as the voice coil motor, the third voice coil motor and the fourth voice coil motor each being configured to generate driving forces in the first direction,
   the first voice coil motor and the second voice coil motor each generate driving forces in an identical direction to perform linear driving in the second direction, and
   the third voice coil motor and the fourth voice coil motor each generate driving forces in opposite directions from each other to perform rotary driving around the third direction.

4. The wavelength converting apparatus according to claim 3, wherein
   the two-dimensional driving unit further includes a movable plate holding the one-dimensional driving unit, and
   the movable plate is driven by the first voice coil motor, the second voice coil motor, the third voice coil motor, and the fourth voice coil motor.

5. The wavelength converting apparatus according to claim 4, wherein
   the two-dimensional driving unit further includes a sliding support member configured to slidably support the movable plate.

6. The wavelength converting apparatus according to claim 2, wherein
   the moving device further includes
      (F) a sealed container including a container body and a bellows,
   the container body accommodates the two-dimensional driving unit, and
   the bellows accommodates the one-dimensional driving unit, and the bellows extends and contracts along the third direction.

7. The wavelength converting apparatus according to claim 2, wherein
   the moving device further includes:
      (G) a container including a container body and a bellows; and
      (H) a chamber including a chamber body, an incidence window, and an emission window,
   the container body accommodates the two-dimensional driving unit,
   the bellows accommodates the one-dimensional driving unit, and the bellows extends and contracts along the third direction,
   the chamber body is connected with the container body so as to surround the crystal holder,
   the incidence window transmits the laser light to make it incident on the nonlinear crystal, and
   the emission window transmits laser light emitted from the nonlinear crystal.

8. The wavelength converting apparatus according to claim 7, wherein
   the chamber further includes:
      a gas introduction pipe configured to introduce purge gas to an inside of the chamber body; and
      a gas discharge pipe configured to discharge the purge gas from the inside of the chamber body.

9. The wavelength converting apparatus according to claim 8, wherein
   the nonlinear crystal is a CLBO crystal, and
   the purge gas is Ar gas or He gas.

10. The wavelength converting apparatus according to claim 1, wherein
    the moving device further includes
       (C) an energizing member configured to energizes the two-dimensional driving unit.

11. The wavelength converting apparatus according to claim 1, wherein
    the driving unit further includes a hall sensor provided corresponding to the planar voice coil motor, and
    the two-dimensional driving unit is controlled based on a detection signal output from the hall sensor.

12. The wavelength converting apparatus according to claim 1, wherein
    the nonlinear crystal is a CLBO crystal.

13. The wavelength converting apparatus according to claim 1, wherein the moving device further includes:
- (D) a heater disposed in the crystal holder; and
- (E) a temperature sensor disposed in the crystal holder, and the heater is controlled based on a detection signal output from the temperature sensor.

14. The wavelength converting apparatus according to claim 13, wherein a plurality of cables connected with the heater and the temperature sensor are inserted inside a yoke, a magnet, and a coil that are included in the cylindrical voice coil motor.

15. The wavelength converting apparatus according to claim 1, wherein the moving device further includes
- (I) a cell accommodating the crystal holder.

16. The wavelength converting apparatus according to claim 15, wherein the cell includes:
- a cell body accommodating the crystal holder;
- an incidence window configured to transmit the laser light and make it incident on the nonlinear crystal;
- an emission window configured to transmit laser light emitted from the nonlinear crystal;
- a gas introduction pipe configured to introduce purge gas to an inside of the cell body; and
- a gas discharge pipe configured to discharge the purge gas from the inside of the chamber body.

17. The wavelength converting apparatus according to claim 16, wherein the nonlinear crystal is a CLBO crystal, and
the purge gas is Ar gas or He gas.

* * * * *